US012668728B2

United States Patent

(12) United States Patent
Akiyoshi et al.

(10) Patent No.: US 12,668,728 B2
(45) Date of Patent: Jun. 30, 2026

(54) ADHESIVE AGENT FOR SEMICONDUCTORS, AND SEMICONDUCTOR DEVICE AND METHOD FOR MANUFACTURING SAME

(71) Applicant: Resonac Corporation, Tokyo (JP)

(72) Inventors: Toshiyasu Akiyoshi, Tokyo (JP); Ryuta Kawamata, Tokyo (JP)

(*) Notice: Subject to any disclaimer, the term of this patent is extended or adjusted under 35 U.S.C. 154(b) by 353 days.

(21) Appl. No.: 18/043,731

(22) PCT Filed: Sep. 13, 2021

(86) PCT No.: PCT/JP2021/033516

§ 371 (c)(1),
(2) Date: Mar. 2, 2023

(87) PCT Pub. No.: WO2022/059639

PCT Pub. Date: Mar. 24, 2022

(65) Prior Publication Data

US 2023/0348764 A1 Nov. 2, 2023

(30) Foreign Application Priority Data

Sep. 16, 2020 (JP) ................................ 2020-155498

(51) Int. Cl.
*H01L 25/065* (2023.01)
*C09J 11/06* (2006.01)
(Continued)

(52) U.S. Cl.
CPC ............. *C09J 163/00* (2013.01); *C09J 11/06* (2013.01); *H10W 90/00* (2026.01); *C09J 2203/326* (2013.01); *H10W 72/07331* (2026.01); *H10W 72/07332* (2026.01); *H10W 72/07338* (2026.01); *H10W 72/354* (2026.01); *H10W 74/15* (2026.01); *H10W 90/297* (2026.01);
(Continued)

(58) Field of Classification Search
CPC ..... H01L 24/29; H01L 25/0657; H01L 24/83; H01L 24/32
See application file for complete search history.

(56) References Cited

U.S. PATENT DOCUMENTS

| | | | | |
|---|---|---|---|---|
| 4,194,931 A * | 3/1980 | Zado | B23K 35/3613 228/223 |
| 2005/0267237 A1* | 12/2005 | Kuroda | C08G 59/68 523/443 |
| 2015/0270188 A1* | 9/2015 | Morita | C08K 5/32 523/434 |

FOREIGN PATENT DOCUMENTS

| | | |
|---|---|---|
| CN | 106574164 | 4/2017 |
| JP | 2004-179552 | 6/2004 |

(Continued)

OTHER PUBLICATIONS

International Search Report dated Nov. 22, 2021 for PCT/JP2021/033516.

(Continued)

*Primary Examiner* — Dale E Page
*Assistant Examiner* — Wilner Jean Baptiste
(74) *Attorney, Agent, or Firm* — SHIPWAY IP

(57) ABSTRACT

An adhesive for a semiconductor, the adhesive containing a thermoplastic resin, a thermosetting resin, a curing agent, and a flux compound having at least one carboxyl group, in which the flux compound has a structure in which an α-position carbon of the carboxyl group is substituted by at least one electron-withdrawing group.

15 Claims, 4 Drawing Sheets

(51) Int. Cl.

| | |
|---|---|
| ***C09J 163/00*** | (2006.01) |
| ***H10W 90/00*** | (2026.01) |
| *H10W 72/00* | (2026.01) |
| *H10W 72/30* | (2026.01) |
| *H10W 74/15* | (2026.01) |
| *H10W 90/20* | (2026.01) |

(52) U.S. Cl.
CPC ........ *H10W 90/722* (2026.01); *H10W 90/724* (2026.01); *H10W 90/732* (2026.01); *H10W 90/734* (2026.01)

(56) References Cited

FOREIGN PATENT DOCUMENTS

| | | |
|---|---|---|
| JP | 2008-294382 | 12/2008 |
| JP | 2011-029392 | 2/2011 |
| JP | 2012-038975 | 2/2012 |
| JP | 2012-089750 | 5/2012 |
| JP | 2012-238704 | 12/2012 |
| JP | 2013-112730 | 6/2013 |
| JP | 2014-209624 | 11/2014 |
| JP | 2015-131969 | 7/2015 |
| JP | 2019-125691 | 7/2019 |
| JP | 2019-173023 | 10/2019 |
| KR | 20200020666 | 2/2020 |
| TW | 201250873 | 12/2012 |
| TW | 201335302 | 9/2013 |
| TW | 201728642 | 8/2017 |
| TW | 201823347 | 7/2018 |
| TW | 201906956 | 2/2019 |
| WO | 2012/053589 | 4/2012 |
| WO | 2012/153846 | 11/2012 |
| WO | 2013/125086 | 8/2013 |
| WO | 2018/235854 | 12/2018 |

OTHER PUBLICATIONS

International Search Report dated Nov. 22, 2021 for PCT/JP2021/033517.

International Preliminary Report on Patentability with Written Opinion dated Mar. 30, 2023 for PCT/JP2021/033516.

International Preliminary Report on Patentability with Written Opinion dated Mar. 30, 2023 for PCT/JP2021/033517.

* cited by examiner

ADHESIVE AGENT FOR SEMICONDUCTORS, AND SEMICONDUCTOR DEVICE AND METHOD FOR MANUFACTURING SAME

CROSS-REFERENCE TO RELATED APPLICATION

This application is a 35 U.S.C. § 371 national phase application of PCT/JP2021/033516, filed on Sep. 13, 2021, which claims priority to Japanese Patent Application No. 2020-155498, filed on Sep. 16, 2020.

TECHNICAL FIELD

The present disclosure relates to an adhesive for a semiconductor, and a semiconductor device and a method for manufacturing the same.

BACKGROUND ART

Conventionally, to connect a semiconductor chip to a substrate, a wire bonding method using metal thin lines such as gold wires has been widely used.

In recent years, to meet requirements for higher functions, larger scale integration, higher speed, and the like of semiconductor devices, a flip chip connection method (FC connection method) has been becoming popular, in which a conductive projection called a bump is formed on a semiconductor chip or a substrate to directly connect the semiconductor chip to the substrate.

Examples of connection between the semiconductor chip and the substrate by the FC connection method also include a COB (Chip On Board) connection method frequently used in BGA (Ball Grid Array), CSP (Chip Size Package), and the like. Furthermore, the FC connection method is also widely used in a COC (Chip On Chip) connection method in which connection portions (bumps or wires) are formed on semiconductor chips to connect the semiconductor chips to each other and a COW (Chip On Wafer) connection method in which connection portions (bumps or wires) are formed on semiconductor wafers to connect the semiconductor chips to the semiconductor wafers (see, for example, Patent Literature 1).

Furthermore, packages for which there is great demand for reductions in size and profile as well as higher functions increasingly use chip-stack package including chips laminated and multi-staged by the aforementioned connection method, or POP (Package On Package), TSV (Through-Silicon Via), and the like. Such laminating and multi-staging techniques dispose semiconductor chips and the like three-dimensionally, which can attain a smaller package than that in use of techniques of disposing semiconductor chips two-dimensionally. Furthermore, the laminating and multi-staging techniques are also effective in an improvement in performance of semiconductors and a reduction in noise, a packaging area, and energy consumption, and receive attention as a semiconductor wiring technique of the next generation.

Incidentally, metal bonding is usually used to connect connection portions from the viewpoint of sufficiently ensuring connection reliability (for example, insulation reliability). Examples of metals mainly used in the above-described connection portions (for example, bumps and wires) include solder, tin, gold, silver, copper, and nickel, and a conductive material containing a plurality of these is also used. The metal used in the connection portion may generate an oxidized film due to oxidation of the surface of the metal, or impurities such as an oxide may adhere to the surface of the metal to generate impurities on a connection surface of the connection portion in some cases. When such impurities remain, there is a concern that connection reliability (for example, insulation reliability) between the semiconductor chip and the substrate or between two semiconductor chips is reduced to impair the merits of adopting the aforementioned connection method.

Furthermore, as a method for suppressing generation of these impurities, there is mentioned a method known as an OSP (Organic Solderbility Preservatives) treatment or the like in which a connection portion is coated with an antioxidizing film; however, this antioxidizing film may cause a reduction in solder wettability during a connection process, a reduction in connectivity, and the like in some cases.

In this regard, as a method for removing the aforementioned oxidized film and impurities, a method for containing a fluxing agent in an adhesive for a semiconductor has been proposed (see, for example, Patent Literature 2).

CITATION LIST

Patent Literature

Patent Literature 1: Japanese Unexamined Patent Publication No. 2008-294382

Patent Literature 2: International Publication WO 2013/125086

SUMMARY OF INVENTION

Technical Problem

In recent years, from the viewpoint of improving productivity, a process of mounting a plurality of semiconductor chips onto a member to be mounted (such as a semiconductor chip, a semiconductor wafer, or a wiring circuit substrate) through an adhesive for a semiconductor and temporarily fixing the plurality of semiconductor chips, and then performing curing and sealing collectively has been proposed. In this process, by applying heat (about 60 to 155° C.) to the stage to the extent that the adhesive for a semiconductor can flow, the semiconductor chips are temporarily fixed onto the member to be mounted, and then reflowed at a temperature (for example, about 260° C.) equal to or higher than the melting point of the connection portion (bump or wire), and the adhesive for a semiconductor is cured collectively. According to this process, a plurality of packages can be efficiently produced.

In the above-described process, voids may remain in the adhesive for a semiconductor in some cases, and in order to prevent generation of such voids, a method of performing collective curing under a pressurized condition has been proposed. However, when the number of semiconductor chips increases, voids may remain even in the above-described method in some cases, and thus it becomes clear that there is room for further improvement.

Therefore, an object of the present disclosure is to reduce voids that may remain in an adhesive for a semiconductor in a process of temporarily fixing a plurality of semiconductor chips onto a member to be mounted through an adhesive for a semiconductor, and then performing curing and sealing collectively.

On the other hand, metal bonding is usually used to connect connection portions from the viewpoint of sufficiently ensuring connectivity and insulation reliability. In a case where the adhesive for a semiconductor does not have sufficient fluxing activity (the effect of removing an oxidized film and impurities on the metal surface), the oxidized film and impurities on the metal surface cannot be removed, favorable metal-metal bonding is not formed, and conduction may not be secured in some cases.

An object of the present disclosure is to provide an adhesive for a semiconductor capable of reducing the aforementioned voids and enabling a semiconductor device excellent in connectivity to be manufactured. Furthermore, an object of the present disclosure is to provide a method for manufacturing a semiconductor device and a semiconductor device that use the above-described adhesive for a semiconductor.

Solution to Problem

In order to achieve the above-described object, the present disclosure provides an adhesive for a semiconductor, the adhesive containing a thermoplastic resin, a thermosetting resin, a curing agent, and a flux compound having at least one carboxyl group, in which the flux compound has a structure in which an α-position carbon of the carboxyl group is substituted by at least one electron-withdrawing group.

The present inventors have speculated that, in a process of temporarily fixing a plurality of semiconductor chips onto a member to be mounted through an adhesive for a semiconductor, and then performing curing and sealing collectively, in a case where the number of semiconductor chips is large, the adhesive for a semiconductor is partially cured during temporary fixing, and as a result, voids are likely to remain in the adhesive for a semiconductor. That is, in the above-described process, since semiconductor chips are sequentially mounted, thermal history by the stage is continuously applied to the semiconductor chip initially mounted and the adhesive for a semiconductor until the mounting of the final semiconductor chip is completed. Therefore, when the number of semiconductor chips increases, curing of the adhesive for a semiconductor to temporarily fix semiconductor chips initially mounted partially progresses, and it is speculated that voids remain without being removed by pressurizing during collective curing. The present inventors have further conducted studies based on the above speculation and have completed the present disclosure.

In the adhesive for a semiconductor of the present disclosure, since the electron-withdrawing group is present at the α-position carbon adjacent to the carboxyl group, the proton of the carboxyl group is easily released, and thus the effect can be exhibited in a state of high fluxing activity. That is, by using the adhesive for a semiconductor of the present disclosure, an oxide coating on the solder surface or an antioxidizing film known in an OSP (Organic Solderbility Preservatives) treatment or the like is removed, and thus solder wettability during a connection process can be improved. Therefore, generation of cracks and peeling at the connection portion can be suppressed, and a semiconductor device excellent in connectivity can be manufactured. Furthermore, according to the adhesive for a semiconductor of the present disclosure, voids that may remain in an adhesive for a semiconductor can be reduced in a process of temporarily fixing a plurality of semiconductor chips onto a member to be mounted through an adhesive for a semiconductor, and then performing curing and sealing collectively.

The flux compound may include a compound having two carboxyl groups. The compound having two carboxyl groups hardly volatilizes even at a high temperature during connection and can further suppress generation of voids, as compared to a compound having one carboxyl group. Furthermore, when the compound having two carboxyl groups is used, compared to the case of using a compound having three or more carboxyl groups, an increase in viscosity of the adhesive for a semiconductor during preservation, working on connection, and the like can be further suppressed, and the connection reliability of the semiconductor device can be further improved.

The flux compound may include a compound represented by General Formula (2-1) or (2-2) below. According to the compound represented by General Formula (2-1) or (2-2) below, the reflow resistance and the connection reliability of a semiconductor device can be further improved.

[Chemical Formula 1]

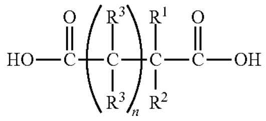

(2-1)

[Chemical Formula 2]

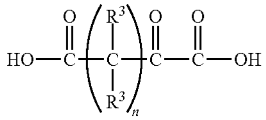

(2-2)

[In Formulae (2-1) and (2-2), $R^1$ represents an electron-withdrawing group, $R^2$ represents a hydrogen atom or an electron-withdrawing group, $R^3$ represents a hydrogen atom or a monovalent organic group, and n represents an integer of 0 to 15; note that, a plurality of $R^3$'s may be the same as or different from each other.]

The flux compound may include a compound represented by General Formula (3-1) or (3-2) below. According to the compound represented by General Formula (3-1) or (3-2) below, the reflow resistance and the connection reliability of a semiconductor device can be further improved.

[Chemical Formula 3]

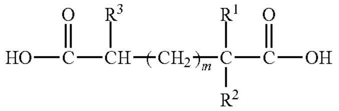

(3-1)

[Chemical Formula 4]

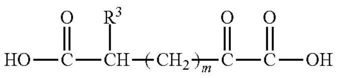

(3-2)

[In Formulae (3-1) and (3-2), $R^1$ represents an electron-withdrawing group, $R^2$ represents a hydrogen atom or an electron-withdrawing group, $R^3$ represents a hydrogen atom or a monovalent organic group, and m represents an integer of 0 to 10.]

The melting point of the flux compound may be 170° C. or lower. Since such a compound sufficiently exhibits fluxing activity before a curing reaction between the thermosetting resin and the curing agent occurs, according to the adhesive for a semiconductor containing this compound, a semiconductor device further excellent in connection reliability can be attained.

The thermosetting resin may include an epoxy resin. According to the adhesive for a semiconductor containing an epoxy resin, a semiconductor device further excellent in connection reliability can be attained.

The curing agent may include an amine-based curing agent. Such a compound exhibits more excellent curing properties by the curing reaction between the thermosetting resin and the curing agent, and thus the reflow resistance of a semiconductor device can be further improved.

The amine-based curing agent may include an imidazole-based curing agent. By using such a compound, the stability of the adhesive for a semiconductor can be further improved.

A structure of the imidazole-based curing agent may be a structure including a triazine ring. By using such a compound, the stability of the adhesive for a semiconductor can be further improved.

Furthermore, the present disclosure provides a method for manufacturing a semiconductor device in which connection portions of a semiconductor chip and a wiring circuit substrate are electrically connected to each other or a semiconductor device in which connection portions of a plurality of semiconductor chips are electrically connected to each other, the method including: a sealing step of curing the above-described adhesive for a semiconductor of the present disclosure by applying heat under a pressurized atmosphere to seal at least a part of the connection portion with the cured adhesive for a semiconductor.

The manufacturing method may further include, before the sealing step: a step of disposing a plurality of semiconductor chips on a stage; and a temporarily fixing step of sequentially disposing another semiconductor chip on each of the plurality of semiconductor chips disposed on the stage with the adhesive for a semiconductor interposed therebetween while the stage is heated to 60 to 155° C. to obtain a plurality of laminates in which the semiconductor chip, the adhesive for a semiconductor, and the other semiconductor chip are laminated in this order.

Alternatively, the manufacturing method may further include, before the sealing step: a step of disposing a wiring circuit substrate or a semiconductor wafer on a stage; and a temporarily fixing step of sequentially disposing a plurality of semiconductor chips on the wiring circuit substrate or the semiconductor wafer disposed on the stage with the adhesive for a semiconductor interposed therebetween while the stage is heated to 60 to 155° C. to obtain a laminate in which the wiring circuit substrate, the adhesive for a semiconductor, and the plurality of semiconductor chips are laminated in this order or a laminate in which the semiconductor wafer, the adhesive for a semiconductor, and the plurality of semiconductor chips are laminated in this order.

Further, the present disclosure provides a semiconductor device in which connection portions of a semiconductor chip and a wiring circuit substrate are electrically connected to each other or a semiconductor device in which connection portions of a plurality of semiconductor chips are electrically connected to each other, at least a part of the connection portion being sealed with a cured product of the above-described adhesive for a semiconductor of the present disclosure cured by applying heat under a pressurized atmosphere.

Advantageous Effects of Invention

According to the present disclosure, voids that may remain in an adhesive for a semiconductor can be reduced in a process of temporarily fixing a plurality of semiconductor chips onto a member to be mounted through an adhesive for a semiconductor, and then performing curing and sealing collectively. According to the present disclosure, it is possible to provide an adhesive for a semiconductor capable of reducing such voids and enabling a semiconductor device excellent in connectivity to be manufactured, and a semiconductor device and a method for manufacturing the same that use this adhesive for a semiconductor.

DESCRIPTION OF EMBODIMENTS

Figure 1:
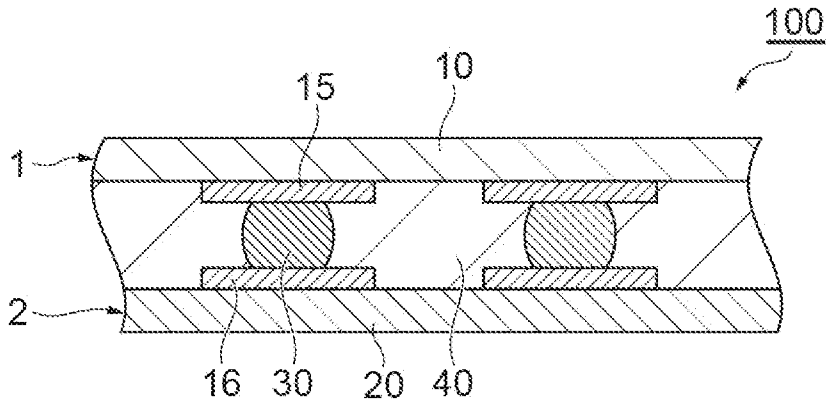
FIG. 1 is a schematic cross-sectional view illustrating an embodiment of a semiconductor device.

Hereinafter, an embodiment of the present disclosure will be specifically described with reference to the drawings in some cases. Note that, In the drawings, same reference numerals are given to identical or equivalent portions, and duplication of description will be omitted. Furthermore, unless otherwise specified, positional relationships such as top, bottom, right, and left are assumed to be based on positional relationships illustrated in the drawings. Further, dimensional ratios in the drawings will not be limited to ratios shown in the drawings.

Upper limit values and lower limit values of numerical ranges described in the present specification can be arbitrarily combined. Numerical values described in Examples can also be used as the upper limit values or the lower limit values of the numerical ranges. In the present specification, the term "(meth)acryl" means acryl or methacryl corresponding thereto.

<Adhesive for Semiconductor and Producing Method Therefor>

An adhesive for a semiconductor of the present embodiment contains a thermoplastic resin (hereinafter, referred to as "component (a)" in some cases), a thermosetting resin (hereinafter, referred to as "component (b)" in some cases), a curing agent (hereinafter, referred to as "component (c)" in some cases), and a flux compound having at least one carboxyl group (hereinafter, referred to as "component (d)" in some cases). The adhesive for a semiconductor of the present embodiment may contain a filler (hereinafter, referred to as "component (e)" in some cases) as necessary.

The exothermic calorific value at 60 to 155° C. of a DSC curve obtained by differential scanning calorimetry (DSC) of the adhesive for a semiconductor of the present embodiment may be 20 J/g or less. Here, the differential scanning calorimetry is performed by setting the weight of the adhesive for a semiconductor as a sample to 10 mg, setting the measurement temperature range to 30 to 300° C., setting the temperature increase rate to 10° C./min, and heating the adhesive for a semiconductor in air or in a nitrogen atmosphere. The exothermic calorific value is calculated by integration of a peak area.

A conventional adhesive for a semiconductor has an exothermic peak in a temperature range of 60 to 155° C. of the DSC curve. The exothermic heat in this temperature range is speculated to be exothermic heat derived from reaction between the thermosetting resin and the flux compound in the adhesive for a semiconductor, and it is speculated that, when this reaction progresses, the adhesive for a semiconductor is partially cured to reduce fluidity. On the other hand, usually, temporary fixing of the semiconductor chip with the adhesive for a semiconductor is performed by heating the adhesive for a semiconductor, for example, to 60 to 155° C. to cause the adhesive for a semiconductor to properly flow. Therefore, when the conventional adhesive for a semiconductor is used in a process of mounting a plurality of semiconductor chips onto a member to be mounted (such as a semiconductor chip, a semiconductor wafer, or a wiring circuit substrate) and temporarily fixing the plurality of semiconductor chips, and then performing curing and sealing collectively under a pressurized condition, the thermosetting resin and the flux compound in the adhesive for a semiconductor react with each other during temporarily fixing the semiconductor chips so that curing of the adhesive for a semiconductor partially progresses, and it is speculated that the adhesive for a semiconductor does not sufficiently flow during collective curing under a pressurized condition in some cases. On the other hand, in the adhesive for a semiconductor of the present embodiment, in a case where the exothermic calorific value at 60 to 155° C. of the DSC curve is 20 J/g or less, and curing is difficult to progress in a temperature range (for example, 60 to 155° C.) at which the semiconductor chip is temporarily fixed. Therefore, by using the adhesive for a semiconductor satisfying the above-described exothermic calorific value condition in the above-described process, the plurality of semiconductor chips can be temporarily fixed while sufficient fluidity of the adhesive for a semiconductor is maintained, and generation of voids during collective curing can be reduced. Further, generation of voids is reduced, and as a result, even when heating is performed at a temperature (for example, 260° C.) equal to or higher than the melting point of the connection portion in a reflow process, it is expected that troubles (such as peeling of the adhesive for a semiconductor and an electrical connection failure at the connection portion) are difficult to occur. That is, according to the adhesive for a semiconductor satisfying the above-described exothermic calorific value condition, there is a tendency that reflow reliability (reflow resistance) can be improved in the manufacturing of a semiconductor device.

The exothermic calorific value at 60 to 155° C. of the DSC curve is preferably 15 J/g or less, more preferably 10 J/g or less, further preferably 5 J/g or less, from the viewpoint of easily obtaining the effects of the present invention. The exothermic calorific value at 60 to 155° C. of the DSC curve may be 20% or less, 15% or less, or 10% or less of the exothermic calorific value at 60 to 280° C., from the viewpoint of easily obtaining the effects of the present invention. The exothermic calorific value at 60 to 280° C. of the DSC curve may be 50 J/g or more or 100 J/g or more, may be 200 J/g or less or 180 J/g or less, and may be 50 to 200 J/g, 100 to 200 J/g, or 100 to 180 J/g, from the viewpoint of easily obtaining the effects of the present invention. It is preferable that the DSC curve does not have an exothermic peak at which the onset temperature is 155° C.' or lower from the viewpoint of easily obtaining the effects of the present invention.

The adhesive for a semiconductor of the present embodiment showing the above-described DSC curve can be obtained, for example, by blending the curing agent and the flux compound so that the ratio of the number of moles of the acid group in the total amount of the flux compound with respect to the number of moles of the reactive group (a group reacting with the acid group of the flux compound) in the total amount of the curing agent reaches 0.01 to 4.8. That is, the method for producing the adhesive for a semiconductor of the present embodiment may include a step of mixing a thermoplastic resin, a thermosetting resin, a curing agent, and a flux compound having at least one carboxyl group, and in this step, the curing agent and the flux compound may be blended so that the ratio of the number of moles of the acid group in the total amount of the flux compound with respect to the number of moles of the reactive group in the total amount of the curing agent reaches 0.01 to 4.8.

The present inventors speculate the reason why the adhesive for a semiconductor showing the above-described DSC curve is obtained by setting the molar ratio of the curing agent and the flux compound in the above range as follows. That is, as described above, the thermosetting resin and the flux compound in the adhesive for a semiconductor react with each other in a temperature range of 60 to 155° C. However, when the molar ratio of the curing agent and the flux compound is in the above range, it is speculated that the flux compound forms a salt with the curing agent before reacting with the thermosetting resin so as to be stabilized. Therefore, it is speculated that the reaction between the thermosetting resin and the flux compound is suppressed, and as a result, the adhesive for a semiconductor showing the above-described DSC curve is obtained.

Hereinafter, each component constituting the adhesive for a semiconductor of the present embodiment will be described.

(a) Thermoplastic Resin

The component (a) is not particularly limited, and examples thereof include a phenoxy resin, a polyimide resin, a polyamide resin, a polycarbodiimide resin, a cyanate ester resin, an acrylic resin, a polyester resin, a polyethylene resin, a polyethersulfone resin, a polyetherimide resin, a polyvinyl acetal resin, a urethane resin, and acrylic rubber. Among these, from the viewpoint of excellent heat resistance and film formability, a phenoxy resin, a polyimide resin, an acrylic resin, acrylic rubber, a cyanate ester resin, and a polycarbodiimide resin are preferable, and a phenoxy resin, a polyimide resin, and an acrylic resin are more preferable. These components (a) can be used singly or can also be used in combinations of two or more kinds thereof as a mixture or a copolymer.

The weight average molecular weight (Mw) of the component (a) is preferably 10000 or more, more preferably 40000 or more, and further preferably 60000 or more. According to such a component (a), film formability and heat resistance of the adhesive can be further improved. Furthermore, when the weight average molecular weight is 10000 or more, since flexibility is easily imparted to a film-shaped adhesive for a semiconductor, further excellent processability is easily obtained. Furthermore, the weight average molecular weight of the component (a) is preferably 1000000 or less and more preferably 500000 or less. According to such a component (a), since the viscosity of a film is decreased, embeddability in the bump becomes favorable, and mounting without much less voids can be performed. From these viewpoints, the weight average molecular weight of the component (a) is preferably 10000 to 1000000, more preferably 40000 to 500000, and further preferably 60000 to 500000.

Note that, in the present specification, the weight average molecular weight refers to a weight average molecular weight measured by using GPC (Gel Permeation Chromatography) in terms of polystyrene. An example of the measurement condition of the GPC method will be shown below.

Apparatus: HCL-8320GPC, UV-8320 (product name, manufactured by Tosoh Corporation), or HPLC-8020 (product name, manufactured by Tosoh Corporation)
Column: TSKgel superMultiporeHZ-M×2, or 2 pieces of GMHXL+1 piece of G-2000XL
Detector: RI or UV detector
Column temperature: 25 to 40° C.
Eluent: select a solvent in which the polymer component is soluble. Examples of the solvent include THF (tetrahydrofuran), DMF (N,N-dimethylformamide), DMA (N,N-dimethylacetoamide), NMP (N-methylpyrrolidone), and toluene. Note that, in the case of selecting a solvent having polarity, the concentration of phosphoric acid may be adjusted to 0.05 to 0.1 mol/L (usually 0.06 mol/L), and the concentration of LiBr may be adjusted to 0.5 to 1.0 mol/L (usually 0.63 mol/L).
Flow rate: 0.30 to 1.5 mL/min
Standard substance: polystyrene A ratio $C_b/C_a$ (mass ratio) of a content $C_b$ of the component (b) with respect to a content $C_a$ of the component (a) is preferably 0.01 or more, more preferably 0.1 or more, and further preferably 1 or more, and is preferably 5 or less, more preferably 4.5 or less, and further preferably 4 or less. When the ratio $C_b/C_a$ is set to 0.01 or more, more favorable curability and a more favorable adhesive force are obtained, and when the ratio $C_b/C_a$ is set to 5 or less, more favorable film formability is obtained. From these viewpoints, the ratio $C_b/C_a$ is preferably 0.01 to 5, more preferably 0.1 to 4.5, and further preferably 1 to 4.

The glass transition temperature of the component (a) is preferably −50° C. or higher, more preferably −40° C.' or higher, and further preferably −30° C. or higher, from the viewpoint of improvement of connection reliability and the like, and is preferably 220° C. or lower, more preferably 200° C.' or lower, and further preferably 180° C.' or lower, from the viewpoint of lamination properties and the like. The glass transition temperature of the component (a) is preferably −50 to 220° C., more preferably −40 to 200° C., and further preferably −30 to 180° C. According to the adhesive for a semiconductor containing such a component (a), in the mounting process on a wafer level, the wafer warpage amount can be further decreased, and heat resistance and film formability of the adhesive for a semiconductor can be further improved. The glass transition temperature of the component (a) can be measured by a differential scanning calorimeter (DSC).

The content of the component (a) is preferably 30% by mass or less, more preferably 25% by mass or less, and further preferably 20% by mass or less, on the basis of the total amount of solid contents of the adhesive for a semiconductor. When the content of the component (a) is 30% by mass or less, the adhesive for a semiconductor can obtain favorable reliability at the time of a temperature cycling test and can obtain a favorable adhesive force at a reflow temperature around 260° C. after the adhesive absorbs moisture. Furthermore, the content of the component (a) is preferably 1% by mass or more, more preferably 3% by mass or more, and further preferably 5% by mass or more, on the basis of the total amount of solid contents of the adhesive for a semiconductor. When the content of the component (a) is 1% by mass or more, in the mounting process on a wafer level, the adhesive for a semiconductor can further decrease the wafer warpage amount and can further improve heat resistance and film formability of the adhesive for a semiconductor. Furthermore, when the content of the component (a) is 5% by mass or more, generation of burr and chipping at the time of trimming into a wafer shape can be suppressed. The content of the component (a) is preferably 1 to 30% by mass and more preferably 3 to 30% by mass, further preferably 5 to 30% by mass, on the basis of the total amount of solid contents of the adhesive for a semiconductor, from the above viewpoint and the viewpoint of easily imparting flexibility to a film-shaped adhesive for a semiconductor and easily obtaining further excellent processability. Note that, the "solid contents of the adhesive for a semiconductor" correspond to the amount obtained by subtracting the amount of the solvent contained in the adhesive for a semiconductor from the total amount of the adhesive for a semiconductor. In the present specification, the "solid contents of the adhesive for a semiconductor" may be rephrased as the "total amount of the components (a) to (e)".

(b) Thermosetting Resin

As the component (b), any thermosetting resin having two or more reactive groups in the molecule can be used without particular limitation. When the adhesive for a semiconductor contains a thermosetting resin, the adhesive can be cured by heating, the cured adhesive exhibits high heat resistance and a high adhesive force to a chip, and excellent reflow resistance is obtained.

Examples of the component (b) include an epoxy resin, a phenol resin, an imide resin, a urea resin, a melamine resin, a silicon resin, a (meth)acrylic compound, and a vinyl compound. Among these, from the viewpoint of excellent heat resistance (reflow resistance) and storage stability, an epoxy resin, a phenol resin, and an imide resin are preferable, an epoxy resin and an imide resin are more preferable, and an epoxy resin is further preferable. These components (b) can be used singly or can also be used in combinations of two or more kinds thereof as a mixture or a copolymer. Among the conventional adhesives for a semiconductor, particularly, in a case where the thermosetting resin is an epoxy resin, a melamine resin, or a urea resin, there is a tendency that the reaction with a flux compound described below is easy to progress at a temperature range of 60 to 155° C. and partial curing progresses before collective curing; however, in the present embodiment, even in a case where the thermosetting resin includes at least one resin selected from the group consisting of an epoxy resin, a melamine resin, and a urea resin, such a reaction and partial curing are less likely to occur.

As the epoxy resin and the imide resin, for example, a bisphenol A type epoxy resin, a bisphenol F type epoxy resin, a naphthalene type epoxy resin, a phenol novolak type epoxy resin, a cresol novolak type epoxy resin, a phenol aralkyl type epoxy resin, a biphenyl type epoxy resin, a triphenylmethane type epoxy resin, a dicyclopentadiene type epoxy resin, and various polyfunctional epoxy resins, a nadimide resin, an allylnadimide resin, a maleimide resin, an amide imide resin, an imide acrylate resin, various polyfunctional imide resins, and various polyimide resins can be used. These can be used singly or in combinations of two or more kinds thereof as a mixture.

From the viewpoint of preventing the component (b) from decomposing to generate a volatile component during connection at a high temperature, the component (b) having a rate of thermal weight loss at 250° C. of 5% or less is preferably used in a case where the temperature during connection is 250° C., and the component (b) having a rate of thermal weight loss at 300° C. of 5% or less is preferably used in a case where the temperature during connection is 300° C.

It is preferable that the component (b) does not substantially contain an epoxy resin that is a liquid at 35° C. (for example, the content of the epoxy resin that is a liquid at 35° C. is 0.1 parts by mass or less with respect to 100 parts by mass of the component (b)). In this case, mounting can be performed without the epoxy resin in a liquid state decomposed and volatilized during thermal press-bonding, and outgas contamination at a chip periphery is suppressed, so that further excellent package throughput properties are easily obtained.

The content of the component (b) is, for example, 5% by mass or more, preferably 15% by mass or more, and more preferably 30% by mass or more, on the basis of the total amount of solid contents of the adhesive for a semiconductor. The content of the component (b) is, for example, 80% by mass or less, preferably 70% by mass or less, and more preferably 60% by mass or less, on the basis of the total amount of solid contents of the adhesive for a semiconductor. The content of the component (b) is, for example, 5 to 80% by mass, preferably 15 to 70% by mass, and more preferably 30 to 60% by mass, on the basis of the total amount of solid contents of the adhesive for a semiconductor.

(c) Curing Agent

The component (c) may be a curing agent that can form a salt with a fluxing agent described below. Examples of the component (c) include amine-based curing agents (amines) and imidazole-based curing agents (imidazoles). When the component (c) includes an amine-based curing agent or an imidazole-based curing agent, fluxing activity to prevent generation of an oxidized film in the connection portion is exhibited, and connection reliability and insulation reliability can be improved. Furthermore, when the component (c) includes an amine-based curing agent or an imidazole-based curing agent, there is a tendency that storage stability is further improved and decomposition or degradation due to absorption of moisture is difficult to occur. Further, when the component (c) includes an amine-based curing agent or an imidazole-based curing agent, the curing rate is easy to adjust and connection can be easily attained in a short time due to fast curability to improve productivity.

Hereinafter, respective curing agents will be described.

(i) Amine-Based Curing Agent

As the amine-based curing agent, for example, dicyandiamide can be used.

The content of the amine-based curing agent is preferably 0.1 parts by mass or more with respect to 100 parts by mass of the component (b). Furthermore, the content of the amine-based curing agent is preferably 10 parts by mass or less and more preferably 5 parts by mass or less, with respect to 100 parts by mass of the component (b). When the content of the amine-based curing agent is 0.1 parts by mass or more, there is a tendency that curability is improved, and when the content thereof is 10 parts by mass or less, there is a tendency that the adhesive for a semiconductor is not cured before metal bonding is formed and a connection failure is less likely to occur. From these viewpoints, the content of the amine-based curing agent is preferably 0.1 to 10 parts by mass and more preferably 0.1 to 5 parts by mass, with respect to 100 parts by mass of the component (b).

(ii) Imidazole-Based Curing Agent

Examples of the imidazole-based curing agent include 2-phenylimidazole, 2-phenyl-4-methylimidazole, 1-benzyl-2-methylimidazole, 1-benzyl-2-phenylimidazole, 1-cyanoethyl-2-undecylimidazole, 1-cyano-2-phenylimidazole, 1-cyanoethyl-2-undecylimidazole trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adducts, 2-phenylimidazole isocyanuric acid adducts, 2-phenyl-4,5-dihydroxymethylimidazole, 2-phenyl-4-methyl-5-hydroxymethylimidazole, and adducts of epoxy resins and imidazoles. Among these, from the viewpoint of excellent curability, storage stability, and connection reliability, 1-cyanoethyl-2-undecylimidazole, 1-cyano-2-phenylimidazole, 1-cyanoethyl-2-undecylimidazole trimellitate, 1-cyanoethyl-2-phenylimidazolium trimellitate, 2,4-diamino-6-[2'-methylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adducts, 2-phenylimidazole isocyanuric acid adducts, 2-phenyl-4,5-dihydroxymethylimidazole, and 2-phenyl-4-methyl-5-hydroxymethylimidazole are preferable. These can be used singly or in combinations of two or more kinds thereof. Furthermore, these may also be formed into a microcapsulized latent curing agent.

The content of the imidazole-based curing agent is preferably 0.1 parts by mass or more with respect to 100 parts by mass of the component (b). Furthermore, the content of the imidazole-based curing agent is preferably 10 parts by mass or less, more preferably 5 parts by mass or less, and further preferably 2.3 parts by mass or less, with respect to 100 parts by mass of the component (b). When the content of the imidazole-based curing agent is 0.1 parts by mass or more, there is a tendency that curability is improved. When the content of the imidazole-based curing agent is 10 parts by mass or less, the adhesive for a semiconductor is not cured before metal bonding is formed, a connection failure is less likely to occur, and generation of voids in the curing process under a pressurized atmosphere is easily suppressed. From these viewpoints, the content of the imidazole-based curing agent is preferably 0.1 to 10 parts by mass, more preferably 0.1 to 5 parts by mass, and further preferably 0.1 to 2.3 parts by mass, with respect to 100 parts by mass of the component (b).

The component (c) can be used singly or in combinations of two or more kinds thereof as a mixture. For example, the imidazole-based curing agent may be used singly or in combination with the amine-based curing agent. As the component (c), a curing agent, which functions as the curing agent of the component (b), other than the above-described curing agents can be used.

The content of the component (c) is preferably 0.5 parts by mass or more with respect to 100 parts by mass of the component (b). Furthermore, the content of the component (c) is preferably 20 parts by mass or less, more preferably 6 parts by mass or less, and further preferably 4 parts by mass or less, with respect to 100 parts by mass of the component (b). In a case where the content of the component (c) is 0.5 parts by mass or more, there is a tendency that curing sufficiently progresses. In a case where the content of the component (c) is 20 parts by mass or less, an increase in the number of reactive sites caused by rapid curing progressing is suppressed to shorten a molecular chain, and the remaining of unreacted groups is suppressed to tend to be likely to suppress deterioration in reliability, and in addition thereto, the remaining of voids during curing under a pressurized atmosphere is likely to be suppressed. From these viewpoints, the content of the component (c) is preferably 0.2 to 20 parts by mass, more preferably 0.5 to 6 parts by mass, and further preferably 0.5 to 4 parts by mass, with respect to 100 parts by mass of the component (b).

The content of the component (c) is preferably 0.5% by mass or more on the basis of the total amount of solid contents of the adhesive for a semiconductor. Furthermore, the content of the component (c) is preferably 2.3% by mass or less, more preferably 2.0% by mass or less, and further preferably 1.5% by mass or less, on the basis of the total amount of solid contents of the adhesive for a semiconductor. In a case where the content of the component (c) is 0.5% by mass or more, there is a tendency that curing sufficiently progresses. In a case where the content of the component (c) is 2.3% by mass or less, an increase in the number of reactive sites caused by rapid curing progressing is suppressed to shorten a molecular chain, and the remaining of unreacted groups is suppressed to tend to be likely to suppress deterioration in reliability, and in addition thereto, the remaining of voids during curing under a pressurized atmosphere is likely to be suppressed. From these viewpoints, the content of the component (c) is preferably 0.5 to 2.3% by mass, more preferably 0.5 to 2.0% by mass, and further preferably 0.5 to 1.5% by mass, on the basis of the total amount of solid contents of the adhesive for a semiconductor.

In a case where the adhesive for a semiconductor contains an amine-based curing agent as the component (c), more excellent curing properties are exhibited by the curing reaction between the amine-based curing agent and the epoxy resin, and thus the reflow resistance of a semiconductor device can be further improved.

(d) Flux Compound

The component (d) is a compound having fluxing activity (activity to remove oxides and impurities), and is, for example, an organic acid. When the adhesive for a semiconductor contains the component (d), an oxidized film of the metal of the connection portion and coating by an OSP treatment can be removed, and thus excellent connection reliability is easily obtained. As the component (d), the flux compound (for example, organic acid) may be used singly or two or more kinds of flux compounds (for example, organic acids) may be used in combination.

The component (d) has at least one carboxyl group as an acid group. When the component (d) is a compound having a carboxyl group (for example, carboxylic acid), further excellent connection reliability is easily obtained. Since the component (d) is a compound having a carboxyl group (for example, carboxylic acid), from the viewpoint of easily obtaining the effects of the present invention, the component (b) is preferably at least one thermosetting resin selected from the group consisting of an epoxy resin, a urethane resin, and a urea resin, and the component (c) is preferably at least one curing agent selected from the group consisting of an amine-based curing agent and an imidazole-based curing agent. Note that, the component (d) may further have an acid group other than the carboxyl group.

The component (d) has a structure in which an α-position carbon of the carboxyl group is substituted by at least one electron-withdrawing group. Examples of the compound having such a structure include a compound having a structure represented by General Formula (1-1), (1-2), or (1-3) below.

[Chemical Formula 5]

(1-1)

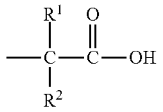

[Chemical Formula 6]

(1-2)

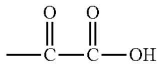

[Chemical Formula 7]

(1-3)

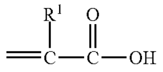

In Formulae (1-1) to (1-3), $R^1$ represents an electron-withdrawing group, and $R^2$ represents a hydrogen atom or an electron-withdrawing group.

Examples of the electron-withdrawing group include a sulfonyl group, a nitro group, a cyano group, a halogen group, and a carbonyl group. The component (d) may have two or more kinds of electron-withdrawing groups. Furthermore, an α-position carbon of the carboxyl group in the component (d) may constitute a part of an electron-withdrawing group. For example, in Formula (1-2) above, the α-position carbon of the carboxyl group becomes a part of the carbonyl group. That is, it can be said that the component (d) has a structure in which an electron-withdrawing group is bonded directly to an α-position carbon of the carboxyl group or a structure in which an α-position carbon of the carboxyl group constitutes a part of an electron-withdrawing group. From the viewpoint of easily obtaining excellent fluxing activity and the viewpoint of easily obtaining the effects of the present invention, the electron-withdrawing group preferably includes at least one selected from the group consisting of a cyano group, a halogen group, and carbonyl group and more preferably includes a carbonyl group.

The component (d) may include a compound represented by General Formula (2-1) or (2-2) below.

[Chemical Formula 8]

(2-1)

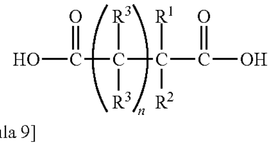

[Chemical Formula 9]

(2-2)

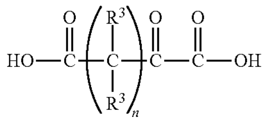

In Formulae (2-1) and (2-2), $R^1$ represents an electron-withdrawing group, $R^2$ represents a hydrogen atom or an electron-withdrawing group, $R^3$ represents a hydrogen atom or a monovalent organic group, and n represents an integer of 0 to 15; note that, a plurality of $R^3$'s may be the same as or different from each other.

The component (d) may include a compound represented by General Formula (3-1) or (3-2) below.

[Chemical Formula 10]

(3-1)

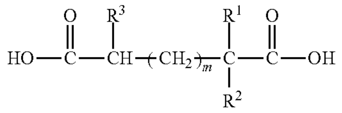

[Chemical Formula 11]

(3-2)

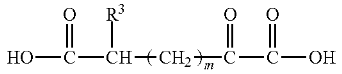

In Formulae (3-1) and (3-2), $R^1$ represents an electron-withdrawing group, $R^2$ represents a hydrogen atom or an electron-withdrawing group, $R^3$ represents a hydrogen atom or a monovalent organic group, and m represents an integer of 0 to 10.

In Formulae (2-1), (2-2), (3-1), and (3-2), $R^3$ may be a hydrogen atom or an alkyl group, and may be a hydrogen atom or an alkyl group having 1 to 10 carbon atoms. "n" may be an integer of 1 to 15. "m" may be an integer of 0 to 15.

The component (d) is preferably a compound having one to three acid groups and more preferably a compound having one to three carboxyl groups as the acid group. The component (d) preferably includes at least one selected from the group consisting of monocarboxylic acid, dicarboxylic acid, and tricarboxylic acid. In the case of using the component (d) having one to three carboxyl groups, compared to the case of using a compound having four or more carboxyl groups, an increase in viscosity of the adhesive for a semiconductor during preservation, working on connection, and the like can be further suppressed, and the connection reliability of the semiconductor device can be further improved.

The component (d) is more preferably a compound (dicarboxylic acid) having two carboxyl groups. In a case where the component (d) is dicarboxylic acid, the component (d) hardly volatilizes even at a high temperature during connection and can further suppress generation of voids, as compared to a compound (monocarboxylic acid) having one carboxyl group. Furthermore, when the compound having two carboxyl groups is used, compared to the case of using a compound having three or more carboxyl groups, an increase in viscosity of the adhesive for a semiconductor during preservation, working on connection, and the like can be further suppressed, and the connection reliability of the semiconductor device can be further improved.

The melting point of the component (d) is preferably 25° C. or higher, more preferably 60° C.' or higher, and further preferably 100° C. or higher, and is preferably 170° C. or lower, more preferably 150° C. or lower, and further preferably 130° C. or lower. In a case where the melting point of the component (d) is 170° C. or lower, fluxing activity is likely to be sufficiently exhibited before the curing reaction between the thermosetting resin and the curing agent. Therefore, according to the adhesive for a semiconductor containing such a component (d), the component (d) is melted at the time of chip mounting, and the oxidized film on the solder surface is removed, so that a semiconductor device further excellent in connection reliability can be attained. Furthermore, in a case where the melting point of the component (d) is 25° C. or higher, the reaction at room temperature or on a high-temperature stage is less likely to start, and storage stability is further excellent. From these viewpoints, the melting point of the component (d) is preferably 25 to 170° C., more preferably 60 to 150° C., and further preferably 100 to 130° C.

The melting point of the component (d) can be measured using a standard melting point measurement apparatus. A small amount of a sample for measuring the melting point needs to be crushed into fine powder to reduce a difference in temperature in the sample. A container of the sample to be used is often a capillary tube whose one end is closed; in some measurement apparatuses, a sample is sandwiched between two cover glasses for a microscope instead of a container. Furthermore, rapid increase in temperature generates temperature gradient between the sample and a thermometer to produce an error in the measurement; therefore, the temperature is desirably raised at an increase rate of 1° C./min or less when the melting point is measured.

The sample for measuring the melting point is prepared as fine powder as described above, and thus the sample before melting is opaque due to diffuse reflection on the surface of the sample. Usually, the temperature when the sample appears to be transparent is defined as the lower limit point of the melting point, and the temperature when the sample is completely melted is defined as the upper limit point. A variety of measurement apparatuses exist, and an apparatus most typically used is an apparatus including a double tube thermometer in which a capillary tube containing a sample is mounted on the thermometer and is heated in a warm bath. To attach the capillary tube to the double tube thermometer, a viscous liquid is used as a liquid for the warm bath, concentrated sulfuric acid or silicone oil is often used, and the capillary tube is attached to the thermometer such that the sample is close to the bulb at the tip of the thermometer. Furthermore, as the melting point measurement apparatus, a melting point measurement apparatus for heating a sample using a metal heat block and automatically determining the melting point while measuring light transmittance and controlling heating can also be used.

Note that, in the present specification, the expression "melting point is 170° C. or lower" indicates that the upper limit point of the melting point is 170° C.' or lower, and the expression "melting point is 25° C. or higher" indicates that the lower limit point of the melting point is 25° C.' or higher.

Specific examples of the component (d) include 2-fluoropropionic acid, fluoromalonaldehydic Acid, 2-fluoroisobutyric acid, 3-amino-2-fluoropropane acid, 2,2-difluoropropionic acid, 2-bromo-2-fluoropropane acid, 1-fluorocyclopropane carboxylic acid, 2-fluoro-3-methylbutanoic acid, chloroacetic acid, 2-chloroacrylic acid, 2-chloropropionic acid, chlorofluoroacetic acid, dichloroacetic acid, bromochloroacetic acid, chloroiodoacetic acid, bromoacetic acid, 2-bromoacrylic acid, 2-bromopropionic acid, dibromoacetic acid, bromoiodoacetic acid, glyoxylic acid, pyruvic acid, oxamic acid, oxalic acid, 2-oxopropanedioic acid, 2-bromopropanedioic acid, oxaloacetic acid, cyanoacetic acid, 1-cyano-1-cyclopropane acid, α-cyanocinnamic acid, α-cyano-3-hydroxycinnamic acid, α-cyano-4-hydroxycinnamic acid, 2-oxobutyric acid, 2-oxopentanoic acid, N,N-dimethyloxamic acid, 4-methyl-2-oxopentanoic acid, 3,3-dimethyl-2-oxobutyric acid, 3-methyl-2-oxopentanoic acid, phenylglyoxylic acid, phenylpyruvic acid, 3-bromo-2-oxopropionic acid, 2-oxo-4-phenylbutyric acid, 4-hydroxyphenylpyruvic acid, (2,6-dimethylanilino)(oxo)acetic acid, 4-hydroxy-3-methoxyphenylpyruvic acid, potassium trihydrogen dioxalate dihydrate, and 2-oxoglutaric acid (α-ketoglutaric acid). Among these, from the viewpoint of easily obtaining excellent fluxing activity and the viewpoint of easily obtaining the effects of the present invention, oxalic acid, 2-oxopropanedioic acid, 2-bromopropanedioic acid, oxaloacetic acid, α-cyano-3-hydroxycinnamic acid, α-cyano-4-hydroxycinnamic acid, 4-hydroxy-3-methoxyphenylpyruvic acid, and 2-oxoglutaric acid are preferable, and 2-oxoglutaric acid is particularly preferable. These can be used singly or in combinations of two or more kinds thereof.

The content of the component (d) is preferably 0.1% by mass or more on the basis of the total amount of solid contents of the adhesive for a semiconductor. Furthermore, the content of the component (d) is preferably 10% by mass or less, more preferably 5% by mass or less, further preferably 2% by mass or less, on the basis of the total amount of solid contents of the adhesive for a semiconductor. The content of the component (d) is preferably 0.1 to 10% by mass, more preferably 0.1 to 5% by mass, and further preferably 0.1 to 2% by mass, on the basis of the total amount of solid contents of the adhesive for a semiconductor, from the viewpoint of connection reliability and reflow resistance at the time of manufacturing a semiconductor device. Note that, in a case where a compound having fluxing activity corresponds to the components (a) to (c), this compound is regarded to also correspond to the component (d), and then the content of the component (d) is calculated. The same applies to the number of moles of the acid group described below, and the like.

In the present embodiment, the ratio of the number of moles of the acid group in the total amount of the component (d) with respect to the number of moles of the reactive group in the total amount of the component (c) is preferably 0.01 or more and is preferably 4.8 or less. The molar ratio is more preferably 0.1 or more and further preferably 0.5 or more, and is more preferably 4.0 or less and further preferably 3.0 or less.

In a case where the component (d) includes at least one selected from the group consisting of monocarboxylic acid, dicarboxylic acid, and tricarboxylic acid, it is preferable that the ratio of the number of moles of the acid group in the total amount of the component (d) with respect to the number of moles of the reactive group in the total amount of the component (c) is 0.01 to 4.8, the ratio of the number of moles of the monocarboxylic acid with respect to the number of moles of the reactive group in the total amount of the component (c) is 0.01 to 4.8, the ratio of the number of moles of the dicarboxylic acid with respect to the number of moles of the reactive group in the total amount of the component (c) is 0.01 to 2.4, and the ratio of the number of moles of the tricarboxylic acid with respect to the number of moles of the reactive group in the total amount of the component (c) is 0.01 to 1.6, and it is more preferable that the ratio of the number of moles of the monocarboxylic acid with respect to the number of moles of the reactive group in the total amount of the component (c) is 0.5 to 3.0, the ratio of the number of moles of the dicarboxylic acid with respect to the number of moles of the reactive group in the total amount of the component (c) is 0.25 to 1.5, and the ratio of the number of moles of the tricarboxylic acid with respect to the number of moles of the reactive group in the total amount of the component (c) is 0.5/3 to 1.0.

(e) Filler

The adhesive for a semiconductor of the present embodiment may contain a filler (component (e)) as necessary. The component (e) can control the viscosity of the adhesive for a semiconductor, physical properties of a cured product of the adhesive for a semiconductor, and the like. Specifically, according to the component (e), for example, suppression of generation of voids during connection, a decrease in moisture absorbing rate of the cured product of the adhesive for a semiconductor, and the like can be achieved.

As the component (e), an insulating inorganic filler, a whisker, a resin filler, and the like can be used. Furthermore, the component (e) may be used singly or may be in combination of two or more kinds thereof.

Examples of the insulating inorganic filler include glass, silica, alumina, titanium oxide, carbon black, mica, and boron nitride. Among these, silica, alumina, titanium oxide, and boron nitride are preferable, and silica, alumina, and boron nitride are more preferable.

Examples of the whisker include aluminum borate, aluminum titanate, zinc oxide, calcium silicate, magnesium sulfate, and boron nitride.

Examples of the resin filler include fillers composed of resins such as polyurethane and polyimide.

The resin filler has a thermal expansion coefficient lower than those of organic components (such as the epoxy resin and the curing agent), and thus is excellent in an effect of improving connection reliability. Furthermore, according to the resin filler, the viscosity of the adhesive for a semiconductor can be easily adjusted. Furthermore, the resin filler has a better function to relax stress than an inorganic filler does.

The inorganic filler has a thermal expansion coefficient lower than that of the resin filler, and according to the inorganic filler, a decrease in thermal expansion coefficient of an adhesive composition can be attained. Furthermore, many inorganic fillers are general-purpose products having a controlled particle diameter, and are also preferable in adjustment of the viscosity.

Since the resin filler and the inorganic filler have their own advantageous effects, depending on use application, one of these may be used, or both may be used by mixing to demonstrate the functions of these fillers.

The shape, the particle diameter, and the content of the component (e) are not particularly limited. Furthermore, the component (e) may be surface-treated to have appropriately controlled physical properties.

The content of the component (e) is preferably 10% by mass or more and more preferably 15% by mass or more, and is preferably 80% by mass or less and more preferably 60% by mass or less, on the basis of the total amount of solid contents of the adhesive for a semiconductor. The content of the component (e) is preferably 10 to 80% by mass and more preferably 15 to 60% by mass, on the basis of the total amount of solid contents of the adhesive for a semiconductor.

The component (e) is preferably composed of an insulating material. When the component (e) is composed of an insulating material, deterioration of insulation reliability (particularly, HAST resistance) is likely to be suppressed as compared to a case where the component (e) is composed of a conductive substance (for example, solder, gold, silver, copper, or the like).

(Other Components)

The adhesive for a semiconductor of the present embodiment may be blended with additives such as an antioxidant, a silane coupling agent, a titanium coupling agent, a leveling agent, and an ion trap agent. These can be used singly or in combinations of two or more kinds thereof. The blending amounts of these may be appropriately adjusted to demonstrate the effects of the respective additives.

The adhesive for a semiconductor of the present embodiment may be formed into a film. In this case, a pre-applied method can improve workability in the case of sealing of a gap between a semiconductor chip and a wiring substrate or gaps between a plurality of semiconductor chips. An example of a method for producing the adhesive for a semiconductor of the present embodiment molded into a film (film-shaped adhesive) will be shown below.

First, the component (a), the component (b), the component (c), and the component (d), as well as the component (e) which is added as necessary and the like are added to an organic solvent, and are dissolved or dispersed by stirring and mixing, kneading, or the like, to prepare a resin varnish. Thereafter, the resin varnish is applied onto a base material film subjected to a releasing treatment by using a knife coater, a roll coater, an applicator, or the like, and then the organic solvent is removed by heating so that a film-shaped adhesive can be formed on the base material film.

The thickness of the film-shaped adhesive is not particularly limited, and for example, is preferably 0.5 to 1.5 times, more preferably 0.6 to 1.3 times, and further preferably 0.7 to 1.2 times the height of a bump before connection.

When the thickness of the film-shaped adhesive is 0.5 times or more the height of the bump, generation of voids caused by not filling the adhesive can be sufficiently suppressed, and connection reliability can be further improved. Furthermore, when the thickness is 1.5 times or less, the amount of the adhesive to be extruded from a chip connection region during connection can be sufficiently suppressed, and thus adhesion of the adhesive to unnecessary portions can be sufficiently prevented. When the thickness of the film-shaped adhesive is more than 1.5 times, a large amount of the adhesive has to be removed from the bumps, so that failure in conduction is likely to occur. Furthermore, removal of a large amount of the resin from the bumps weakened because of a narrower pitch and an increasing number of pins (reduction in a bump diameter) is not preferable because the removal damages the bumps significantly.

Since a standard height of the bump is 5 to 100 μm, the thickness of the film-shaped adhesive is preferably 2.5 to 150 μm and more preferably 3.5 to 120 μm.

The organic solvent used to prepare the resin varnish is preferably those that can uniformly dissolve or disperse the respective components, and examples thereof include dimethylformamide, dimethylacetoamide, N-methyl-2-pyrrolidone, dimethyl sulfoxide, diethylene glycol dimethyl ether, toluene, benzene, xylene, methyl ethyl ketone, tetrahydrofuran, ethyl cellosolve, ethyl cellosolve acetate, butyl cellosolve, dioxane, cyclohexanone, and ethyl acetate. These organic solvents can be used singly or in combinations of two or more kinds thereof. In preparation of the resin varnish, stirring and mixing or kneading can be performed, for example, by using a stirrer, a mortar machine, a triple roll mill, a ball mill, a bead mill, or a homo-disper.

The base material film is not particularly limited as long as it has heat resistance to endure a heating condition when the organic solvent is volatilized, and examples thereof include polyolefin films such as polypropylene films and polymethylpentene films, polyester films such as polyethylene terephthalate films and polyethylene naphthalate films, polyimide films, and polyether imide films. The base material film is not limited to a single layer composed of one of these films, and may be a multi-layer film composed of two or more kinds of materials.

The drying condition when the organic solvent is volatilized from the resin varnish applied onto the base material film is preferably set to a drying condition in which the organic solvent sufficiently volatilizes, and specifically, drying is preferably performed by heating at 50 to 200° C. for 0.1 to 90 minutes. The organic solvent is preferably removed to 1.5% by mass or less with respect to the total amount of the film-shaped adhesive.

Furthermore, the adhesive for a semiconductor of the present embodiment may be formed directly on a wafer. Specifically, for example, a layer composed of the adhesive for a semiconductor may be formed directly on a wafer by applying the resin varnish onto a wafer directly by spin coating to form a film, and then removing the organic solvent.

The minimum melt viscosity of the adhesive for a semiconductor of the present embodiment is preferably 200 to 10000 Pa·s and more preferably 200 to 5000 Pa·s, from the viewpoint of further easily removing voids during curing under a pressurized atmosphere and obtaining further excellent reflow resistance. The minimum melt viscosity can be measured by the method described in Examples. The temperature (melt temperature) at which the adhesive for a semiconductor has the minimum melt viscosity is preferably 100 to 250° C., more preferably 120 to 230° C., and further preferably 140 to 200° C.

From the viewpoint of facilitating temporary fixing of the semiconductor chip in a temperature range of 60 to 170° C., the adhesive for a semiconductor of the present embodiment preferably has a melt viscosity at 80° C. of 2000 to 30000 Pa·s and a melt viscosity at 130° C. of 400 to 20000 Pa·s, and more preferably has a melt viscosity at 80° C. of 4000 to 20000 Pa·s and a melt viscosity at 130° C. of 400 to 5000 Pa·s. The above-described melt viscosity can be measured by the method described in Examples.

The adhesive for a semiconductor of the present embodiment having been described above can be suitably used in a process of curing the adhesive for a semiconductor by applying heat under a pressurized atmosphere, and can be suitably used particularly in a process of mounting a plurality of semiconductor chips onto a member to be mounted (such as a semiconductor chip, a semiconductor wafer, or a wiring circuit substrate) through an adhesive for a semiconductor and temporarily fixing the plurality of semiconductor chips, and then performing curing and sealing the adhesive for a semiconductor collectively under a pressurized condition. In the case of the adhesive for a semiconductor of the present embodiment in this process, voids inside the adhesive are easily removed by pressurizing, and further excellent reflow resistance is easily obtained.

<Semiconductor Device>

A semiconductor device of the present embodiment is a semiconductor device in which connection portions of a semiconductor chip and a wiring circuit substrate are electrically connected to each other or a semiconductor device in which connection portions of a plurality of semiconductor chips are electrically connected to each other. In this semiconductor device, at least a part of the connection portion is sealed with a cured product of the adhesive for a semiconductor cured by applying heat under a pressurized atmosphere. Hereinafter, the semiconductor device of the present embodiment will be described with reference to FIG. 1, FIG. 2, and FIG. 3. Each of FIG. 1, FIG. 2, and FIG. 3 is a cross-sectional view illustrating an embodiment of a semiconductor device manufactured by a method of an embodiment described below.

FIG. 1 is a schematic cross-sectional view illustrating a COB connection mode between a semiconductor chip and a substrate. A semiconductor device 100 illustrated in FIG. 1 includes a semiconductor chip 1, a substrate 2 (wiring circuit substrate), and an adhesive layer 40 interposed therebetween. In the case of the semiconductor device 100, the semiconductor chip 1 has a semiconductor chip main body 10, wires or bumps 15 disposed on the surface of the semiconductor chip main body 10 on the substrate 2 side, and solders 30 as connection portions disposed on the wires or bumps 15. The substrate 2 has a substrate main body 20 and wires or bumps 16 as connection portions disposed on the surface of the substrate main body 20 on the semiconductor chip 1 side. The solders 30 of the semiconductor chip 1 and the wires or bumps 16 of the substrate 2 are electrically connected to each other by metal bonding. The semiconductor chip 1 and the substrate 2 are flip chip connected to each other through the wires or bumps 16 and the solders 30. The wires or bumps 15 and 16 and the solders 30 are sealed with the adhesive layer 40 to be shielded against an external environment.

Figure 2:
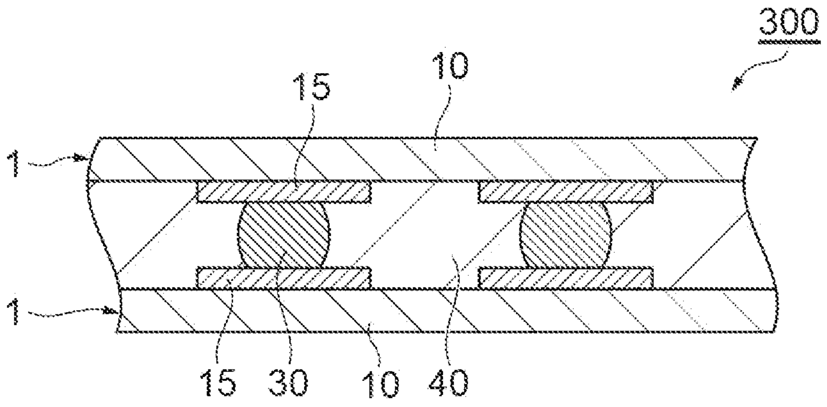
FIG. 2 is a schematic cross-sectional view illustrating an embodiment of a semiconductor device.
Figure 3:
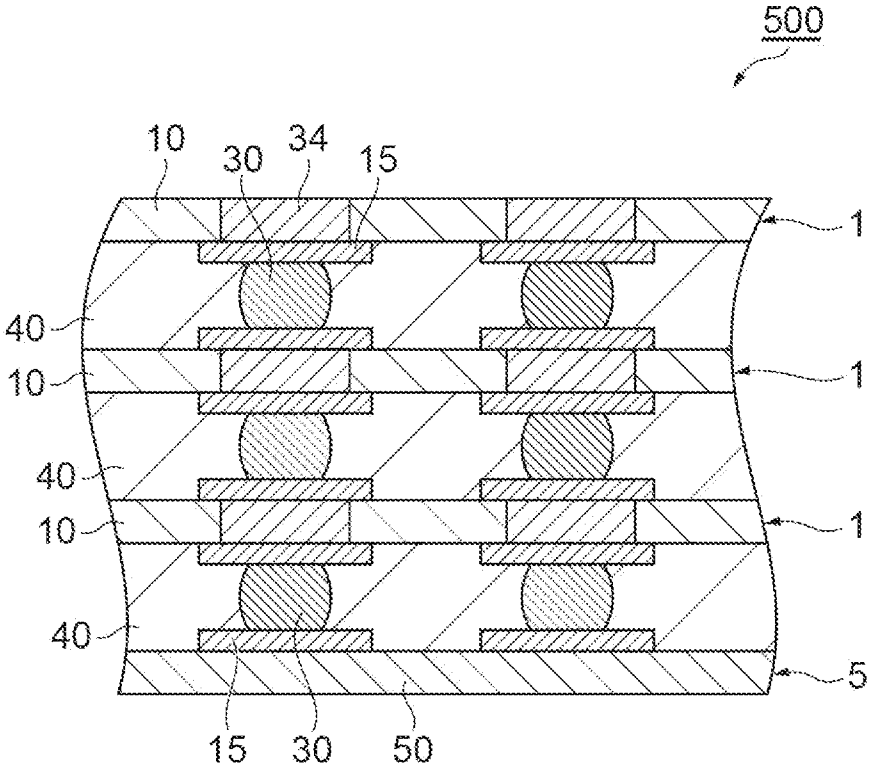
FIG. 3 is a schematic cross-sectional view illustrating an embodiment of a semiconductor device.

FIG. 2 illustrates a COC connection mode between semiconductor chips. The configuration of a semiconductor device 300 illustrated in FIG. 2 is the same as that of the semiconductor device 100, except that two semiconductor chips 1 are flip chip connected to each other through the wires or bumps 15 and the solders 30.

In FIG. 1 and FIG. 2, the connection portions such as the wires or bumps 15 may be metal films (for example, gold plating) called pads, and may be post electrodes (for example, copper pillars).

The semiconductor chip main body 10 is not particularly limited, and various semiconductors such as an element semiconductor configured from one identical element such as silicon and germanium and a compound semiconductor including gallium arsenic and indium phosphorus can be used.

The substrate 2 is not particularly limited as long as it is a wiring circuit substrate, and a circuit substrate having wires (wiring pattern) formed on the surface of an insulating substrate including glass epoxy, polyimide, polyester, ceramic, epoxy, bismaleimide triazine, or the like as a main component by removing unnecessary portions of a metal layer by etching, a circuit substrate having wires (wiring pattern) formed on the surface of the insulating substrate by metal plating or the like, a circuit substrate having wires (wiring pattern) formed by printing a conductive substance on the surface of the insulating substrate, and the like can be used.

As materials for the connection portions such as the wires or bumps 15 and 16 and the solders 30, gold, silver, copper, solder (the main component thereof is, for example, tin-silver, tin-lead, tin-bismuth, tin-copper, or tin-silver-copper), tin, nickel, and the like are used as a main component, and the connection portions may be configured by only single component and may be configured by a plurality of components. The connection portion may have a structure in which these metals are laminated. Among the metallic materials, copper and solder are relatively inexpensive, which is preferable. From the viewpoint of improving connection reliability and suppressing warpage, the connection portion may contain solder.

As materials for the pads, gold, silver, copper, solder (the main component thereof is, for example, tin-silver, tin-lead, tin-bismuth, tin-copper, or tin-silver-copper), tin, nickel, and the like are used as a main component, and the connection portions may be configured by only single component and may be configured by a plurality of components. The pad may have a structure in which these metals are laminated. From the viewpoint of connection reliability, the pad may contain gold or solder.

A metal layer containing gold, silver, copper, solder (the main component thereof is, for example, tin-silver, tin-lead, tin-bismuth, or tin-copper), tin, nickel, or the like as a main component may be formed on the surfaces of the wires or bumps 15 and 16 (wiring pattern). This metal layer may be configured by only single component and may be configured by a plurality of components. The metal layer may have a structure in which a plurality of metal layers are laminated. The metal layer may contain copper or solder that is relatively inexpensive. From the viewpoint of improving connection reliability and suppressing warpage, the metal layer may contain solder.

The semiconductor devices (package) as illustrated in FIG. 1 or FIG. 2 may be laminated and electrically connected by gold, silver, copper, solder (the main component thereof is, for example, tin-silver, tin-lead, tin-bismuth, tin-copper, tin-silver-copper), tin, nickel, or the like. The metal to be used for connection may be copper or solder that is relatively inexpensive. For example, as seen in the TSV technique, the adhesive layer may be interposed between the semiconductor chips, the semiconductor chips may be flip chip connected or laminated, holes penetrating through the semiconductor chip may be formed, and electrodes on the patterned surface may be connected.

FIG. 3 is a cross-sectional view illustrating another embodiment of the semiconductor device (an embodiment of a semiconductor chip laminate type (TSV)). In a semiconductor device 500 illustrated in FIG. 3, the wires or bumps 15 formed on an interposer main body 50 as a substrate are connected to the solders 30 of the semiconductor chip 1 to flip chip connect the semiconductor chip 1 and an interposer 5 to each other. The adhesive layer 40 is interposed between the semiconductor chip 1 and the interposer 5. The semiconductor chips 1 are repeatedly laminated on the surface of the semiconductor chip 1 on a side opposite to the interposer 5 with wires or bumps 15, the solders 30, and the adhesive layer 40 interposed therebetween. The wires or bumps 15 on the patterned surface on the front and rear sides of the semiconductor chip 1 are connected to each other through penetrating electrodes 34 provided inside of holes penetrating through the semiconductor chip main body 10. As the material for the penetrating electrode 34, copper, aluminum, or the like can be used.

Such a TSV technique enables acquisition of signals from the rear surface of the semiconductor chip, which is usually not used. Further, the penetrating electrode 34 is vertically passed through the semiconductor chip 1 to reduce the distance between the semiconductor chips 1 facing each other and the distance between the semiconductor chip 1 and the interposer 5, so that flexible connection can be attained. The adhesive layer can be applied as a sealing material between the semiconductor chips 1 facing each other and between the semiconductor chip 1 and the interposer 5 in such a TSV technique.

<Method for Manufacturing Semiconductor Device>

An embodiment of the method for manufacturing a semiconductor device includes a lamination step of laminating a first member having a connection portion and a second member having a connection portion with an adhesive for a semiconductor interposed therebetween so that the connection portion of the first member and the connection portion of the second member are disposed to face each other, and a sealing step of curing the adhesive for a semiconductor by applying heat under a pressurized atmosphere to seal at least a part of the connection portion with the cured adhesive for a semiconductor. Here, the first member is, for example, a wiring circuit substrate, a semiconductor chip, or a semiconductor wafer, and the second member is a semiconductor chip. In the sealing step, the connection portions disposed to face each other are bonded to be electrically connected to each other by heating the laminate obtained in the lamination step to a temperature equal to or higher than a melting point of the connection portions disposed to face each other under a pressurized atmosphere.

In a case where the first member is a semiconductor chip, the lamination step includes, for example, a step of disposing a plurality of semiconductor chips on a stage, and a temporarily fixing step of sequentially disposing another semiconductor chip on each of the plurality of semiconductor chips disposed on the stage with the adhesive for a semiconductor interposed therebetween while the stage is heated to obtain a plurality of laminates (temporarily fixed bodies) in which the semiconductor chip, the adhesive for a semiconductor, and the other semiconductor chip are laminated in this order.

In a case where the first member is a wiring circuit substrate or a semiconductor wafer, the lamination step includes, for example, a step of disposing a wiring circuit substrate or a semiconductor wafer on a stage; and a temporarily fixing step of sequentially disposing a plurality of semiconductor chips on the wiring circuit substrate or the semiconductor wafer disposed on the stage with the adhesive for a semiconductor interposed therebetween while the stage is heated to obtain a laminate (temporarily fixed body) in which the wiring circuit substrate, the adhesive for a semiconductor, and the plurality of semiconductor chips are laminated in this order or a laminate (temporarily fixed body) in which the semiconductor wafer, the adhesive for a semiconductor, and the plurality of semiconductor chips are laminated in this order.

In the temporarily fixing step, for example, first, the adhesive for a semiconductor is disposed in the first member or on the second member (for example, a film-shaped adhesive for a semiconductor is pasted). Next, each of the semiconductor chips individually divided on a dicing tape is picked up, adsorbed to a press-bonding tool (press-bonding head) of a press-bonding machine, and temporarily fixed to a wiring circuit substrate, another semiconductor chip, or a semiconductor wafer.

The method of disposing the adhesive for a semiconductor is not particularly limited, and for example, in a case where the adhesive for a semiconductor has a film shape, a method such as heat press, roll lamination, or vacuum lamination may be employed. The area and thickness of the adhesive for a semiconductor to be disposed are appropriately set depending on the sizes of the first member and the second member, the height of the connection portion (bump), and the like. The adhesive for a semiconductor may be disposed on the semiconductor chip, and the semiconductor wafer on which the adhesive for a semiconductor is disposed is diced and then individually divided into semiconductor chips.

In the temporarily fixing step, it is necessary to perform alignment to electrically connect the connection portions to each other. Therefore, generally, a press-bonding machine such as a flip chip bonder is used.

When the semiconductor chip is picked up by the press-bonding tool for temporary fixing, the press-bonding tool is preferably set to a low temperature so that heat is not transferred to the adhesive for a semiconductor or the like on the semiconductor chip. On the other hand, during press-bonding (temporary press-bonding), the semiconductor chip is preferably heated to a high temperature so that the fluidity of the adhesive for a semiconductor can be increased to efficiently eliminate trapped voids. However, heating is preferably to a temperature lower than the initiation temperature of the curing reaction of the adhesive for a semiconductor. In order to shorten the cooling time, a difference in temperature between the press-bonding tool during picking-up the semiconductor chip and the press-bonding tool during temporary fixing is preferably smaller. This temperature difference is preferably 100° C. or lower, more preferably 60° C. or lower, and substantially further preferably 0° C. When the temperature difference is 100° C. or higher, it takes a time to cool the press-bonding tool, and thus productivity tends to be deteriorated. The initiation temperature of the curing reaction of the adhesive for a semiconductor refers to an onset temperature as measured using DSC (manufactured by PerkinElmer Inc., DSC-Pyirs 1) under the conditions including a sample amount of 10 mg, a temperature increase rate of 10° C./min, and air or nitrogen atmosphere.

A load applied for temporary fixing is appropriately set in consideration of controlling of the number of connection portions (bumps), absorption of variations in height of connection portions (bumps), the deformation amount of connection portions (bumps), and the like. In the temporarily fixing step, after press-bonding (temporary press-bonding), connection portions facing each other are preferably in contact with each other. When the connection portions are in contact with each other after press-bonding, there is a tendency that the metal bonding of the connection portions in press-bonding (main press-bonding) in the sealing step is likely to be formed, and biting of the adhesive for a semiconductor is reduced. The load is preferably larger for eliminating voids and contacting the connection portions, and the load is, for example, preferably 0.0001 N to 0.2 N, more preferably 0.0005 to 0.15 N, and even more preferably 0.001 to 0.1 N, per one connection portion (for example, bump).

The press-bonding time in the temporarily fixing step is preferably shorter from the viewpoint of improving productivity, and may be, for example, 5 seconds or shorter, 3 seconds or shorter, or 2 seconds or shorter.

The heating temperature of the stage is a temperature lower than the melting point of the connection portion of the first member and the melting point of the connection portion of the second member, and may be usually 60 to 150° C. or 70 to 100° C. By heating at such a temperature, voids trapped in the adhesive for a semiconductor can be efficiently eliminated.

The temperature of the press-bonding tool during temporary fixing is preferably set such that a temperature difference between the temperature of the press-bonding tool during temporary fixing and the temperature of the press-bonding tool during picking up the semiconductor chips is small as described above, and may be, for example, 80 to 350° C. or 100 to 170° C.

In a case where the lamination step includes the temporarily fixing step described above, in the sealing step subsequent to the temporarily fixing step, the adhesives for a semiconductor of a plurality of laminates or a laminate including a plurality of semiconductor chips may be collectively cured, and a plurality of connection portions may be sealed collectively. Through the sealing step, the connection portions facing each other are bonded by metal bonding, and usually, a gap between the connection portions is filled with the adhesive for a semiconductor. The sealing step is performed using an apparatus capable of heating to a temperature equal to or higher than the melting point of the metal of the connection portion and capable of pressurizing. Examples of the apparatus include a pressurizing reflow furnace and a pressure oven.

The heating temperature (connection temperature) in the sealing step is preferably a temperature equal to or higher than at least one melting point of metal of the melting points of connection portions facing each other (for example, bump-bump, bump-pad, or bump-wire). For example, in a case where the metal of the connection portion is solder, the heating temperature is preferably 200° C. or higher and 450° C. or lower. When the heating temperature is a low temperature, the metal of the connection portion is not melted, and sufficient metal bonding may not be formed. When the heating temperature is an excessively high temperature, there is a tendency that the effect of suppressing voids is relatively reduced, or solder is easy to scatter.

When pressurizing for bonding of the connection portions is performed using a press-bonding machine, heat of the press-bonding machine is difficult to transfer to the adhesive for a semiconductor (fillet) protruding on the side surface of the connection portion, and thus a heating treatment is further necessary for sufficiently conducting the curing of the adhesive for a semiconductor after press-bonding (main press-bonding) in many cases. Therefore, the pressurizing in the sealing step is preferably performed at an atmospheric pressure inside a pressurizing reflow furnace, a pressure oven, or the like instead of a press-bonding machine. In the case of pressurizing with an atmospheric pressure, heat can be applied to the whole adhesive, the heating treatment after press-bonding (main press-bonding) can be shortened or omitted, and thus productivity is improved. Furthermore, in the case of pressurizing with an atmospheric pressure, the main press-bonding of a plurality of laminates (temporarily fixed body) or a laminate (temporarily fixed body) including a plurality of semiconductor chips temporarily fixed is easy to be performed collectively. Further, not direct pressurizing using a press-bonding machine but pressurizing with an atmospheric pressure is preferable from the viewpoint of suppressing fillet. Fillet suppression is important with respect to tendencies of a decrease in size and an increase in density of a semiconductor device.

The atmosphere under which press-bonding is performed in the sealing step is not particularly limited, but an atmosphere containing air, nitrogen, formic acid, or the like is preferable.

The pressure of press-bonding in the sealing step is appropriately set depending on the size, the number, and the like of members to be connected. The pressure may be, for example, more than an atmospheric pressure and 1 MPa or less. A larger pressure is preferable from the viewpoint of suppressing voids and improving connectivity, and a smaller pressure is preferable from the viewpoint of suppressing fillet. Therefore, the pressure is more preferably 0.05 to 0.5 MPa.

The press-bonding time varies depending on the constituent metal of the connection portion, but is preferably shorter from the viewpoint of improving productivity. In a case where the connection portion is a solder bump, the connection time is preferably 20 seconds or shorter, more preferably 10 seconds or shorter, and further preferably 5 seconds or shorter. In the case of metal connection of copper-copper or copper-gold, the connection time is preferably 60 seconds or shorter.

In a case where a plurality of semiconductor chips are laminated in a stereoscopic manner as shown in a semiconductor device having a TSV structure, a semiconductor device may be obtained by stacking the semiconductor chips one by one in a state of being temporarily fixed, and then collectively heating and pressurizing the plurality of semiconductor chips laminated.

Examples

Hereinafter, the present disclosure will be more specifically described by means of Examples; however, the present disclosure is not limited to the following Examples.

The compounds used in Examples and Comparative Examples are as follows.

Component (a): Thermoplastic Resin
- Polyurethane (manufactured by DIC Covestro Polymer Ltd., trade name "T-8175N", Tg: −23° C., Mw: 120000)
- Phenoxy resin (manufactured by Nippon Steel & Sumikin Chemical Co., Ltd., trade name "FX293", Tg: about 160° C., Mw: about 40000)

Component (b): Thermosetting Resin
- Triphenolmethane skeleton-containing polyfunctional solid epoxy (manufactured by Mitsubishi Chemical Corporation, trade name "EP1032H60")
- Bisphenol F type liquid epoxy (manufactured by Mitsubishi Chemical Corporation, trade name "YL983U")

Component (c): Curing Agent
- 2,4-Diamino-6-[2'-methylimidazolyl-(1')]-ethyl-s-triazine isocyanuric acid adduct (manufactured by SHIKOKU CHEMICALS CORPORATION, trade name "2MAOK-PW", Mw: 384)

Component (d): Flux Compound
- α-ketoglutaric acid (manufactured by FUJIFILM Wako Pure Chemical Corporation, melting point: 118° C., Mw: 146)
- Glutaric acid (manufactured by FUJIFILM Wako Pure Chemical Corporation, melting point: 98° C., Mw: 132)
- Benzilic acid (manufactured by FUJIFILM Wako Pure Chemical Corporation, melting point: 152° C., Mw: 228)

(e) Filler
- Silica filler (manufactured by ADMATECHS COMPANY LIMITED, trade name "SE2030", average particle diameter: 0.5 μm)
- Expoxysilane-surface-treated silica filler (manufactured by ADMATECHS COMPANY LIMITED, trade name "SE2030-SEJ", average particle diameter: 0.5 μm).
- Methacrylic-surface-treated silica filler (manufactured by ADMATECHS COMPANY LIMITED, trade name "YA050C-SM1", average particle diameter: about 0.05 μm)

The weight average molecular weight (Mw) of the component (a) is determined by a GPC method. The details of the GPC method are as shown below.

Device name: HPLC-8020 (product name, manufactured by Tosoh Corporation)

Column: 2 pieces of GMHXL+1 piece of G-2000XL

Detector: RI detector

Column temperature: 35° C.

Flow rate: 1 mL/min

Standard substance: polystyrene

<Production of Film-Shaped Adhesive for Semiconductor>

A thermoplastic resin, a thermosetting resin, a curing agent, a flux compound, and a filler were added to an organic solvent (cyclohexanone) in blending amounts (unit: parts by mass) shown in Table 1 so that the NV value ([the mass of the coating material content after drying]/[the mass of the coating material content before drying]×100) reached 50%. Thereafter, ϕ1.0 mm zirconia beads and ϕ2.0 mm zirconia beads were added into the same container at the mass equal to the blending amount of solid contents (the thermoplastic resin, the thermosetting resin, the curing agent, the flux compound, and the filler) and stirred for 30 minutes with a ball mill (Fritsch Japan Co., Ltd., planetary pulverizing mill P-7). After stirring, the zirconia beads were removed by filtration to prepare a coating varnish.

The obtained coating varnish was applied onto a base material film (manufactured by Teijin DuPont films Japan Ltd., trade name "Purex A55") with a compact precision coating apparatus (manufactured by Yasui Seiki Company, Ltd.) and dried in a clean oven (manufactured by ESPEC CORP.) (100° C./10 min) to obtain a film-shaped adhesive having a film thickness of 20 μm.

Hereinafter, an evaluation method of the film-shaped adhesives obtained in Examples and Comparative Examples is shown. The evaluation results are shown in Table 1.

<DSC Measurement>

10 mg of the obtained film-shaped adhesive was weighed in an aluminum pan (manufactured by Epolead Service Inc.), the aluminum pan was covered with an aluminum lid, and an evaluation sample was hermetically sealed in a sample pan by using a crimper. The measurement was performed using a differential scanning calorimeter (Thermo plus DSC8235E, manufactured by Rigaku Corporation) under a nitrogen atmosphere at a temperature increase rate of 10° C./min and in a measurement temperature range of 30 to 300° C. As an analytical means for the exothermic calorific value, an analysis method of a partial area was used, and an analysis instruction in a temperature range of 60 to 280° C. of each DSC curve was made to perform baseline designation of an analysis temperature range and integration of a peak area, thereby calculating the total exothermic calorific value (unit: J/g). Subsequently, an instruction to set 155° C. as a divided temperature was made to integrate each partial area at 60 to 155° C. and 155 to 280° C., thereby calculating each exothermic calorific value (unit: J/g). On the other hand, as an analytical means of the onset temperature, an analysis method of the total area (JIS method) was used, and an analysis instruction in a temperature range of 60 to 280° C. was made to calculate an intersecting point between the baseline of a peak in each DSC curve and the maximum incline point, thereby determining the onset temperature (unit: ° C.).

<High-Temperature Stability Evaluation>

The film-shaped adhesive (initial sample) each obtained in Examples and Comparative Examples was put in an oven set at 80° C. and subjected to a heating treatment for 6 hours, and then the sample was taken out to obtain an evaluation sample A after being heat-treated at 80° C.

The film-shaped adhesive (initial sample) each obtained in Examples and Comparative Examples was put in an oven set at 100° C. and subjected to a heating treatment for 1 hour, and then the sample was taken out to obtain an evaluation sample B after being heat-treated at 100° C.

The exothermic calorific value (unit: J/g) at 60 to 250° C. was calculated according to the same procedure as that before the heating treatment with a differential scanning calorimeter (Thermo plus DSC8235E, manufactured by Rigaku Corporation) by using the evaluation sample A and the evaluation sample B. This value was regarded as an exothermic calorific value after the heat treatment.

The reaction rate was calculated by the following equation using two exothermic calorific values thus obtained (the exothermic calorific value of the initial sample and the exothermic calorific value of the evaluation sample A or the exothermic calorific value of the initial sample and the exothermic calorific value of the evaluation sample B).

Reaction rate (%)=(Initial exothermic calorific value−Exothermic calorific value after heat treatment)/Initial exothermic calorific value×100

A case where the reaction rate is less than 5% was determined as "A", a case where the reaction rate is 5% or more and less than 10% was determined as "B", and a case where the reaction rate is 10% or more was determined as "C".

<Viscosity Measurement>

Each of the film-shaped adhesives (initial samples) obtained in Examples and Comparative Examples was used, and a plurality of the film-shaped adhesives were overlapped using a tabletop laminator (product name: Hotdog GK-13DX, manufactured by LAMI CORPORATION INC.) and laminated to have a thickness of 400 μm, thereby producing a sample for viscosity measurement. As for lamination conditions, lamination was performed under an apparatus setting temperature of 50° C. and an apparatus transportation velocity level of 9.

The laminated samples for viscosity measurement were punched using a 10 mm-square punch, and the melt temperature at 80° C. (80° C. viscosity), the melt temperature at 130° C. (130° C. viscosity), the minimum melt viscosity, and the temperature (melt temperature) at which the minimum melt viscosity was shown were measured using the initial samples of Examples and Comparative Examples and the evaluation sample A with a rotary rheometer (manufactured by TA Instruments, trade name: ARES-G2).

[Measurement Conditions]

Measurement tool size: 9 mmϕ

Sample thickness: 400 μm

Temperature increase rate: 10° C./min

Frequency: 10 Hz

Temperature range: 30 to 170° C.

<Void Evaluation>

(Production of Laminate C (Temporarily Fixed Body C) after Temporary Press-Bonding)

The film-shaped adhesives (initial samples) obtained in Examples and Comparative Examples were laminated using a tabletop laminator (product name: Hotdog GK-13DX, manufactured by LAMI CORPORATION INC.) to have a film thickness of 40 μm, and then cut into a size of 7.5 mm×7.5 mm, and the cut film-shaped adhesives were pasted at 80° C. onto a plurality of solder bump-attached semiconductor chips (chip size: 7.3 mm×7.3 mm, thickness 0.1 mm, bump (connection portion) height: about 45 μm (total of copper pillar and solder), the number of bumps: 1048 pins, pitch 80 μm, product name: WALTS-TEG CC80, manufactured by WALTS CO., LTD.). Chips for a semiconductor attached with the film-shaped adhesive were sequentially press-bonded and temporarily fixed to other semiconductor chips (chip size: 10 mm×10 mm, thickness 0.1 mm, the number of bumps: 1048 pins, pitch 80 μm, product name: WALTS-TEG IP80, manufactured by WALTS CO., LTD.) by heating and pressurizing with a flip chip bonder (FCB3, manufactured by Panasonic Corporation), thereby obtaining a laminate C (temporarily fixed body C) after temporary press-bonding. The press-bonding conditions were set to 130° C., 75 N, and 3 seconds.

The laminate (temporarily fixed body C) after temporary press-bonding described above was put in an oven set at 80° C. and subjected to a heating treatment for 6 hours, and then the sample was taken out to obtain a laminate D (temporarily fixed body D)) heat-treated at 80° C. after temporary press-bonding.

The laminate D (temporarily fixed body D) after temporary press-bonding described above was placed in an oven of a pressurized oven apparatus (manufactured by NTT Advanced Technology Corporation). The pressure inside the oven was set to 0.8 MPa, and the temperature was raised from room temperature to 190° C. at a temperature increase rate of 20° C./min. Next, the press-bonded body was heated for 1 hour under a pressurized atmosphere while the pressure and the temperature were maintained, thereby obtaining a mounting sample E for evaluation.

(Analysis and Evaluation)

An image of the appearance of the mounting sample for evaluation described above was taken with an ultrasonic image diagnostic apparatus (product name: Insight-300, manufactured by Insight k.k.).

[Measurement Conditions]

Probe frequency: 180 MHz

Diagnosis mode: Echo (pulse-echo method)

From the obtained image, an image of the adhesive layer between chips was imported by a scanner (GT-9300UF, manufactured by Seiko Epson Corporation). The imported image was subjected to color tone correction and black and white conversion with an image processing software (Adobe Photoshop (trade name)) to distinguish void portions, and the proportion of the void portions was calculated based on a histogram. The area of the entire adhesive layer including void portions was regarded as 100 area %. A case where the area ratio of voids is less than 10% was determined as "A", a case where the area ratio of voids is 10% or more and less than 30% was determined as "B", and a case where the area ratio of voids is 30% or more was determined as "C". The evaluation results are shown in Table 1.

<Crack Confirmation of Connection Portion>

(Production of Laminate F (Temporarily Fixed Body F) after Temporary Press-Bonding)

The film-shaped adhesives (initial samples) obtained in Examples and Comparative Examples were laminated using a tabletop laminator (product name: Hotdog GK-13DX, manufactured by LAMI CORPORATION INC.) to have a film thickness of 40 μm, and then cut into a size of 7.5 mm×7.5 mm, and the cut film-shaped adhesives were pasted at 80° C. onto a plurality of solder bump-attached semiconductor chips (chip size: 7.3 mm×7.3 mm, thickness 0.1 mm, bump (connection portion) height: about 45 μm (total of copper pillar and solder), the number of bumps: 1048 pins, pitch 80 μm, product name: WALTS-TEG CC80, manufactured by WALTS CO., LTD.). Chips for a semiconductor attached with the film-shaped adhesive were sequentially press-bonded and temporarily fixed to other semiconductor chips (chip size: 10 mm×10 mm, thickness 0.1 mm, the number of bumps: 1048 pins, pitch 80 μm, product name: WALTS-TEG IP80, manufactured by WALTS CO., LTD.) by heating and pressurizing with a flip chip bonder (FCB3, manufactured by Panasonic Corporation), thereby obtaining a laminate F (temporarily fixed body F) after temporary press-bonding. As for the press-bonding conditions, press-bonding was performed by applying heat in a stepwise manner of 190° C./25 N/10 sec, 260° C./25 N/20 sec, and 100° C./25 N/5 sec (temperature increase setting time of each temperature increase: 0.1 seconds).

The laminate F (temporarily fixed body F) after temporary press-bonding described above was placed in an oven of a pressurized oven apparatus (manufactured by NTT Advanced Technology Corporation). The pressure inside the oven was set to 0.8 MPa, and the temperature was raised from room temperature to 190° C.' at a temperature increase rate of 20° C./min. Next, the press-bonded body was heated for 1 hour under a pressurized atmosphere while the pressure and the temperature were maintained, thereby obtaining a mounting sample G for evaluation.

The mounting sample for evaluation described above was polished using a tabletop polishing machine (Refine Polisher, manufactured by Refine Tec Ltd.) until the bump connection portion existing inside the chip was exposed. As waterproof abrasive paper used for polishing, first, waterproof abrasive paper having a size of 200 cmϕ and a grain size of 1000 was used and then changed to waterproof abrasive paper having a grain size of 2000, and then polishing was performed until the connection portion was exposed. Thereafter, polishing was further performed using alumina liquid (suspension liquid) A-0.3 microns (manufactured by Refine Tec Ltd.). The exposed bump connection portion was observed with an SEM (TM3030Plus tabletop microscope, manufactured by Hitachi High-Technologies Corporation), and the existence of cracks inside the solder and at the solder-Cu wire interface.

<Evaluation of Connectivity>

Figure 4:
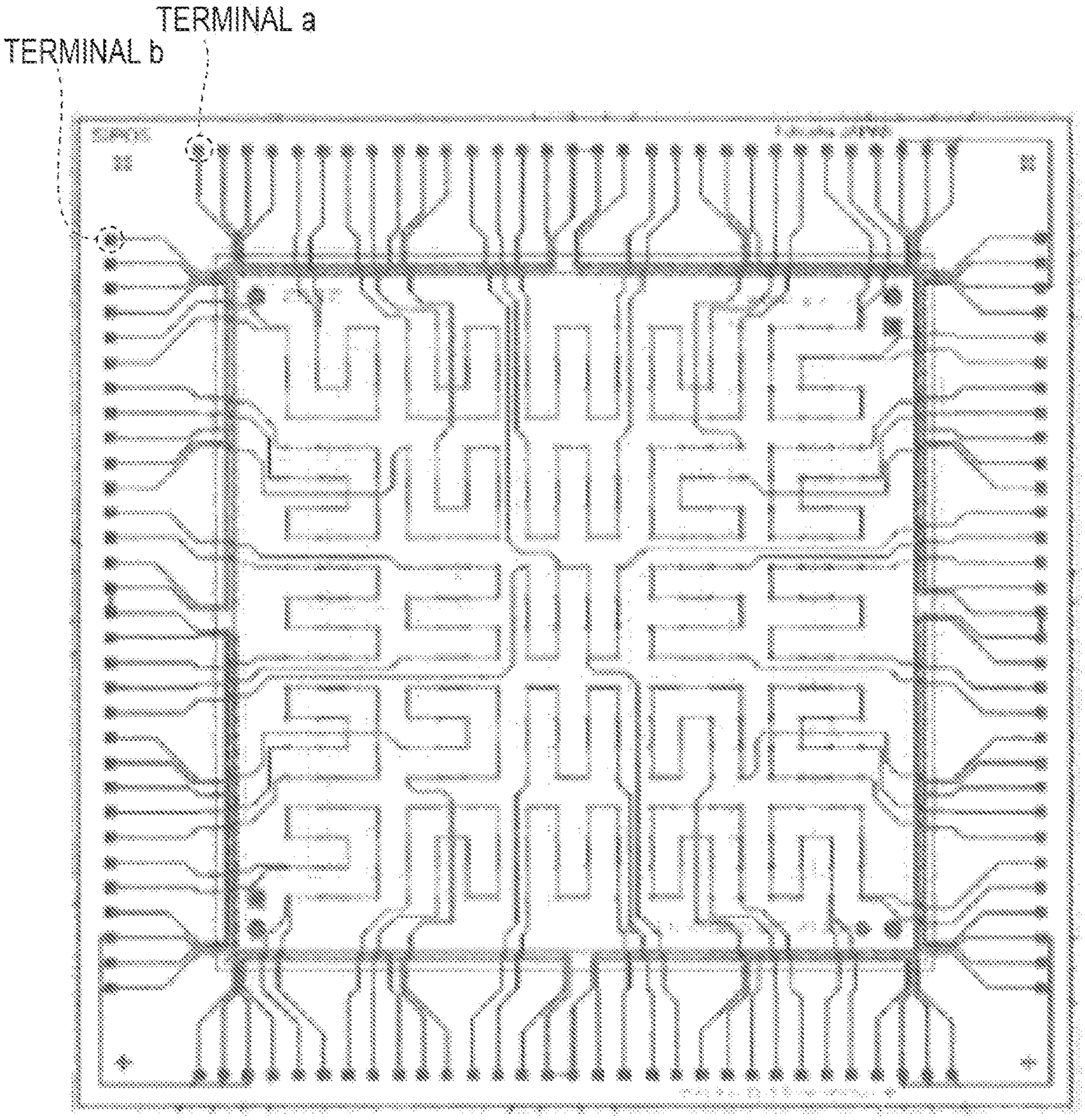
FIG. 4 is a circuit diagram of a semiconductor chip used in evaluation of connectivity.

As for the obtained mounting sample G for evaluation, the connectivity was evaluated by measuring a resistance value of the chip inner periphery using a circuit tester (POCKET TESTER 4300 COUNT, manufactured by CUSTOM corporation). FIG. 4 illustrates a circuit diagram of a lower chip used for mounting (chip size: 7.3 mm×7.3 mm, thickness 0.1 mm, bump (connection portion) height: about 45 μm (total of copper pillar and solder), the number of bumps: 1048 pins, pitch 80 μm, product name: WALTS-TEG CC80, manufactured by WALTS CO., LTD.). In this circuit, a resistance value between the terminal a and the terminal b in the drawing corresponds to a resistance value of the chip inner periphery. A case where this resistance value is less than 35Ω indicates good connectivity, and a case where the resistance value is 35Ω or more or the resistance value cannot be measured indicates a connection failure.

<Evaluation of Solder Wettability>

As for the mounting samples for evaluation described above, similarly to the crack confirmation of the connection portion, the cross-section of the connection portion was observed using an SEM, a case where 90% or more of the upper surface of a Cu wire wetted with solder was evaluated as "A" (good), and a case where less than 90% of the upper surface of a Cu wire wetted with solder was evaluated as "B" (insufficient wettability).

TABLE 1

| | | Example | | | | | Comparative Example | |
|---|---|---|---|---|---|---|---|---|
| | | 1 | 2 | 3 | 4 | 5 | 1 | 2 |
| Component (a) | T8175N | 12.6 | 12.7 | 12.9 | 11.7 | 11.3 | — | 12.9 |
| | FX293 | — | — | — | — | — | 12.2 | — |
| Component (b) | EP1032H60 | 38.0 | 38.5 | 39.0 | 35.5 | 33.5 | 27.4 | 39.0 |
| | YL983U | — | — | — | — | — | 12.2 | — |

TABLE 1-continued

| | | Example | | | | | Comparative Example | |
|---|---|---|---|---|---|---|---|---|
| | | 1 | 2 | 3 | 4 | 5 | 1 | 2 |
| Component (c) | 2MAOK | 2.5 | 1.3 | 1.3 | 1.2 | 1.1 | 2.4 | 1.3 |
| Component (d) | α-ketoglutaric acid | 2.5 | 2.6 | 1.3 | 1.2 | 1.1 | — | — |
| | Glutaric acid | — | — | — | — | — | 2.4 | — |
| | Benzilic acid | — | — | — | — | — | — | 1.3 |
| Component (e) | SE2030 | 8.9 | 9.0 | 9.1 | 10.1 | 10.6 | 8.7 | 9.1 |
| | SE2030-SEJ | 8.9 | 9.0 | 9.1 | 10.1 | 10.6 | 8.7 | 9.1 |
| | YA050C-SM1 | 26.6 | 26.9 | 27.3 | 30.2 | 31.8 | 26.0 | 27.3 |
| DSC measurement (initial) | Onset temperature (° C.) | 166 | 166 | 166 | 165 | 165 | 154 | 146 |
| | Exothermic calorific value @60-155° C. (J/g) | −9 | −4 | −16 | −13 | −9 | 21 | 8 |
| | Exothermic calorific value @155-280° C. (J/g) | 102 | 74 | 83 | 81 | 80 | 152 | 67 |
| | Exothermic calorific value @60-280° C. (J/g) | 93 | 70 | 67 | 68 | 71 | 173 | 75 |
| DSC measurement (after 80° C./6 h treatment) | Exothermic calorific value @60-280° C. (J/g) | 93 | 70 | 67 | 68 | 69 | 148 | 66 |
| | Reaction rate (%) | 0 | 0 | 0 | 0 | 3 | 14 | 12 |
| | High-temperature standing stability | A | A | A | A | A | C | B |
| DSC measurement (after 100° C./1 h treatment) | Exothermic calorific value @60-280° C. (J/g) | 93 | 70 | 67 | 68 | 70 | 134 | 48 |
| | Reaction rate (%) | 0 | 0 | 0 | 0 | 1 | 23 | 36 |
| | High-temperature standing stability | A | A | A | A | A | C | C |
| Viscosity measurement | 80° C. viscosity (Pa · s) | 13200 | 9400 | 8500 | 10500 | 14100 | 7500 | 12700 |
| | 130° C. viscosity (Pa · s) | 4000 | 2900 | 2800 | 3600 | 5700 | 3900 | 3300 |
| | Minimum melt viscosity (Pa · s) | 3000 | 2400 | 2100 | 3300 | 5600 | 3800 | 1600 |
| | Melt temperature (° C.) | 147 | 142 | 146 | 146 | 145 | 133 | 141 |
| Void evaluation after mounting | | A | A | A | A | A | B | B |
| Crack of connection portion | | Absent | Absent | Absent | Absent | Absent | Absent | Present |
| Connectivity (electric resistance) (Ω) | | 32 | 32 | 32 | 32 | 32 | 32 | 40 |
| Solder wettability | | A | A | A | A | A | A | B |

REFERENCE SIGNS LIST

1: semiconductor chip, 2: substrate, 10: semiconductor chip main body, 15, 16: wire or bump, 20: substrate main body, 30: solder, 34: penetrating electrode, 40: adhesive layer, 50: interposer main body, 100, 300, 500: semiconductor device.

The invention claimed is:

1. An adhesive for a semiconductor, the adhesive comprising: a thermoplastic resin; a thermosetting resin; a curing agent; and a flux compound having at least one carboxyl group, wherein the flux compound has a structure in which an α-position carbon of the carboxyl group is substituted by at least one electron-withdrawing group, and wherein the flux compound comprises a compound represented by General Formula (2-1) or (2-2) below:

(2-1)

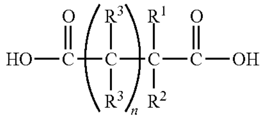

(2-2)

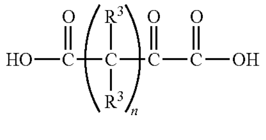

wherein $R^1$ represents an electron-withdrawing group, $R^2$ represents a hydrogen atom or an electron-withdrawing group, $R^3$ represents a hydrogen atom or a monovalent organic group, and n represents an integer of 0 to 15, provided that a plurality of $R^3$'s are the same as or different from each other.

2. The adhesive for a semiconductor according to claim 1, wherein the flux compound represented by General Formula (2-1) is a compound represented by General Formula (3-1), and wherein the flux compound represented by General Formula (2-2) is a compound represented by General Formula (3-2), as shown below:

(3-1)

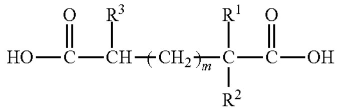

(3-2)

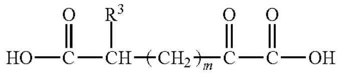

wherein m represents an integer of 0 to 10.

3. The adhesive for a semiconductor according to claim 1, wherein a melting point of the flux compound is 170° C. or lower.

4. The adhesive for a semiconductor according to claim 1, wherein the thermosetting resin comprises an epoxy resin.

5. The adhesive for a semiconductor according to claim 1, wherein the curing agent comprises an amine-based curing agent.

6. The adhesive for a semiconductor according to claim 1, wherein the curing agent comprises an imidazole-based curing agent.

7. The adhesive for a semiconductor according to claim 6, wherein the imidazole-based curing agent comprises a triazine ring.

8. A method for manufacturing a semiconductor device in which connection portions of a semiconductor chip and a wiring circuit substrate are electrically connected to each other or a semiconductor device in which connection portions of a plurality of semiconductor chips are electrically connected to each other, the method comprising:

a sealing step of curing the adhesive for a semiconductor according to claim 1 by applying heat under a pressurized atmosphere to seal at least one of the connection portions with the cured adhesive for a semiconductor.

9. The method for manufacturing a semiconductor device according to claim 8, further comprising, before the sealing step:

a step of disposing a plurality of semiconductor chips on a stage; and a temporarily fixing step of sequentially disposing another semiconductor chip on each of the plurality of semiconductor chips disposed on the stage with the adhesive for a semiconductor interposed therebetween while the stage is heated to 60 to 155° C. to obtain a plurality of laminates in which the semiconductor chip, the adhesive for a semiconductor, and the other semiconductor chip are laminated in this order.

10. The method for manufacturing a semiconductor device according to claim 8, further comprising, before the sealing step:

a step of disposing a wiring circuit substrate or a semiconductor wafer on a stage; and a temporarily fixing step of sequentially disposing a plurality of semiconductor chips on the wiring circuit substrate or the semiconductor wafer disposed on the stage with the adhesive for a semiconductor interposed therebetween while the stage is heated to 60 to 155° C. to obtain a laminate in which the wiring circuit substrate, the adhesive for a semiconductor, and the plurality of semiconductor chips are laminated in this order or a laminate in which the semiconductor wafer, the adhesive for a semiconductor, and the plurality of semiconductor chips are laminated in this order.

11. A semiconductor device in which connection portions of a semiconductor chip and a wiring circuit substrate are electrically connected to each other or a semiconductor device in which connection portions of a plurality of semiconductor chips are electrically connected to each other, at least one of the connection portions being sealed with a cured product of the adhesive for a semiconductor according to claim 1 cured by applying heat under a pressurized atmosphere.

12. A method for manufacturing a semiconductor device in which connection portions of a semiconductor chip and a wiring circuit substrate are electrically connected to each other or a semiconductor device in which connection portions of a plurality of semiconductor chips are electrically connected to each other, the method comprising:

a sealing step of curing an adhesive for a semiconductor by applying heat under a pressurized atmosphere to seal at least one of the connection portions with the cured adhesive for a semiconductor, wherein the adhesive for a semiconductor comprises: a thermoplastic resin; a thermosetting resin; a curing agent; and a flux compound having at least one carboxyl group, and wherein the flux compound has a structure in which an α-position carbon of the carboxyl group is substituted by at least one electron-withdrawing group.

13. The method for manufacturing a semiconductor device according to claim 12, further comprising, before the sealing step:

a step of disposing a plurality of semiconductor chips on a stage; and a temporarily fixing step of sequentially disposing another semiconductor chip on each of the plurality of semiconductor chips disposed on the stage with the adhesive for a semiconductor interposed therebetween while the stage is heated to 60 to 155° C. to obtain a plurality of laminates in which the semiconductor chip, the adhesive for a semiconductor, and the other semiconductor chip are laminated in this order.

14. The method for manufacturing a semiconductor device according to claim 12, further comprising, before the sealing step:

a step of disposing a wiring circuit substrate or a semiconductor wafer on a stage; and a temporarily fixing step of sequentially disposing a plurality of semiconductor chips on the wiring circuit substrate or the semiconductor wafer disposed on the stage with the adhesive for a semiconductor interposed therebetween while the stage is heated to 60 to 155° C. to obtain a laminate in which the wiring circuit substrate, the adhesive for a semiconductor, and the plurality of semiconductor chips are laminated in this order or a laminate in which the semiconductor wafer, the adhesive for a semiconductor, and the plurality of semiconductor chips are laminated in this order.

15. A semiconductor device in which connection portions of a semiconductor chip and a wiring circuit substrate are electrically connected to each other or a semiconductor device in which connection portions of a plurality of semiconductor chips are electrically connected to each other, at least one of the connection portions being sealed with a cured product of an adhesive for a semiconductor cured by applying heat under a pressurized atmosphere, wherein the adhesive comprises: a thermoplastic resin; a thermosetting resin; a curing agent; and a flux compound having at least one carboxyl group, and wherein the flux compound has a structure in which an α-position carbon of the carboxyl group is substituted by at least one electron-withdrawing group.

* * * * *